(12) United States Patent
Muranaka

(10) Patent No.: US 9,966,455 B2
(45) Date of Patent: May 8, 2018

(54) METHOD FOR MANUFACTURING A SEMICONDUCTOR DEVICE

(71) Applicant: Renesas Electronics Corporation, Tokyo (JP)

(72) Inventor: Seiji Muranaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 15/657,670

(22) Filed: Jul. 24, 2017

(65) Prior Publication Data
US 2018/0090597 A1 Mar. 29, 2018

(30) Foreign Application Priority Data
Sep. 26, 2016 (JP) .................................. 2016-186996

(51) Int. Cl.
| | |
|---|---|
| *H01L 21/338* | (2006.01) |
| *H01L 21/3205* | (2006.01) |
| *H01L 21/4763* | (2006.01) |
| *H01L 29/66* | (2006.01) |
| *H01L 29/08* | (2006.01) |
| *H01L 21/265* | (2006.01) |
| *H01L 21/3105* | (2006.01) |

(Continued)

(52) U.S. Cl.
CPC .. *H01L 29/66545* (2013.01); *H01L 21/02068* (2013.01); *H01L 21/26513* (2013.01); *H01L 21/31053* (2013.01); *H01L 21/32134* (2013.01); *H01L 21/67057* (2013.01); *H01L 21/67086* (2013.01); *H01L 29/0847* (2013.01); *H01L 29/45* (2013.01); *H01L 21/0214* (2013.01); *H01L 21/02164* (2013.01); *H01L 21/324* (2013.01); *H01L 29/0649* (2013.01); *H01L 29/4966* (2013.01); *H01L 29/517* (2013.01)

(58) Field of Classification Search
CPC ......... H01L 21/02068; H01L 21/26513; H01L 29/66545
USPC ........................................ 438/183, 591, 595
See application file for complete search history.

(56) References Cited

U.S. PATENT DOCUMENTS

| | | | |
|---|---|---|---|
| 8,264,048 B2* | 9/2012 | Rachmady | ........ H01L 21/28114 257/213 |
| 9,177,807 B2 | 11/2015 | Shinohara | |

(Continued)

FOREIGN PATENT DOCUMENTS

| | | |
|---|---|---|
| JP | 2008-041939 A | 2/2008 |
| JP | 2012-099517 A | 5/2012 |

(Continued)

*Primary Examiner* — David S Blum
(74) *Attorney, Agent, or Firm* — Mattingly & Malur, PC

(57) ABSTRACT

The reliability of a semiconductor device is improved. A first gate electrode of a dummy gate electrode including silicon is formed over a semiconductor substrate. Then, by an ion implantation method, a semiconductor region for source or drain of MISFET is formed in the semiconductor substrate. Then, over the semiconductor substrate, an insulation film is formed in such a manner as to cover the first gate electrode. Then, the insulation film is polished to expose the first gate electrode. Then, the surface of the first gate electrode is wet etched by APM. then, the first gate electrode is removed by wet etching using aqueous ammonia. Thereafter, a gate electrode for MISFET is formed in a region from which the first gate electrode has been removed.

20 Claims, 19 Drawing Sheets

(51) Int. Cl.
*H01L 21/3213* (2006.01)
*H01L 29/45* (2006.01)
*H01L 21/02* (2006.01)
*H01L 21/67* (2006.01)
H01L 21/324 (2006.01)
H01L 29/06 (2006.01)
H01L 29/51 (2006.01)
H01L 29/49 (2006.01)

(56) References Cited

U.S. PATENT DOCUMENTS 9,331,077 B2 5/2016 Matsunmoto
2016/0071944 A1* 3/2016 Lu ................... H01L 29/42376
257/392

FOREIGN PATENT DOCUMENTS

| JP | 2013-026466 A | 2/2013 |
| JP | 2014-127527 A | 7/2014 |

* cited by examiner

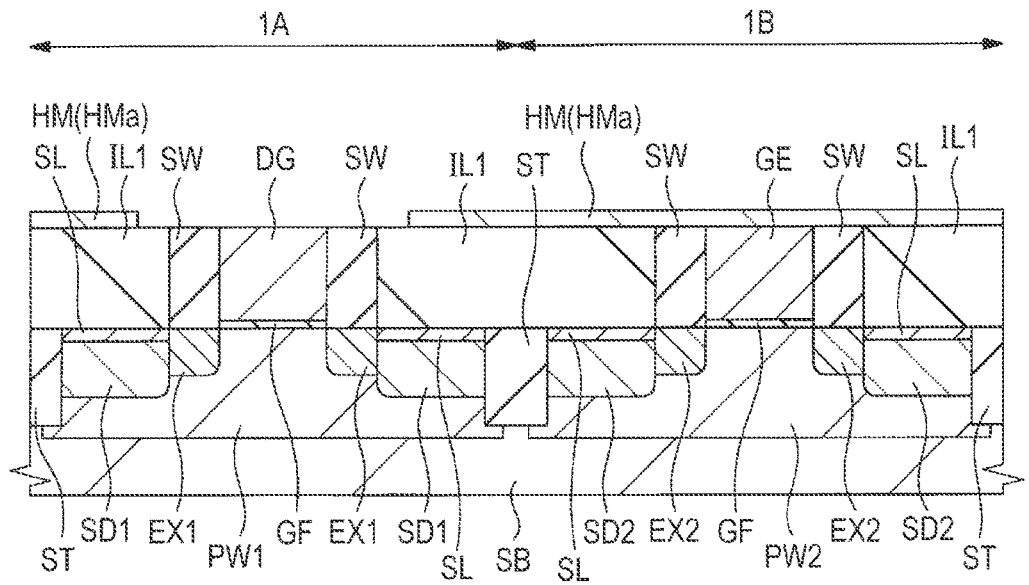
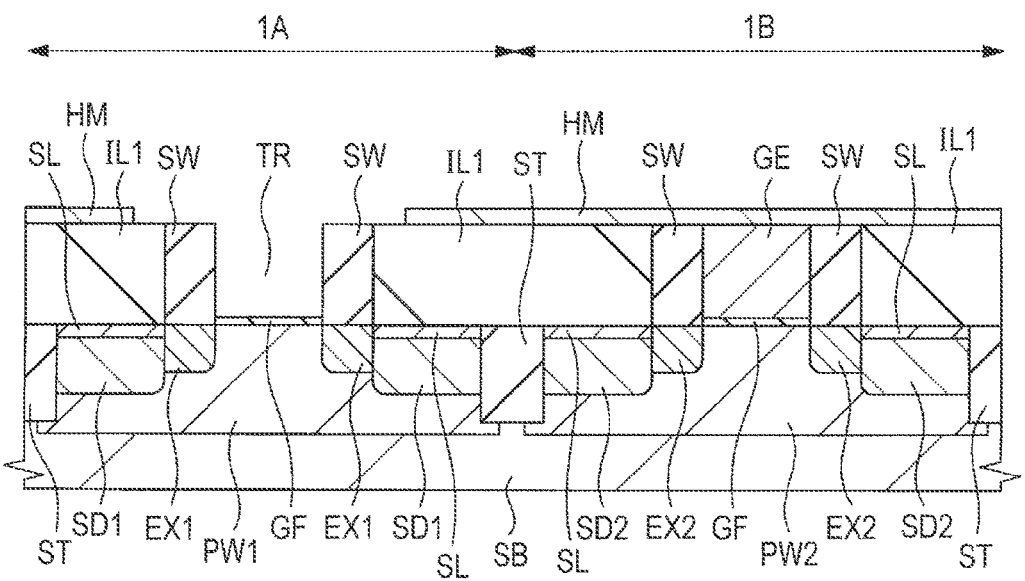

METHOD FOR MANUFACTURING A SEMICONDUCTOR DEVICE

CROSS-REFERENCE TO RELATED APPLICATIONS

The disclosure of Japanese Patent Application No. 2016-186996 filed on Sep. 26, 2016 including the specification, drawings and abstract is incorporated herein by reference in its entirety.

BACKGROUND

The present invention relates to a method for manufacturing a semiconductor device, and is preferably applicable to, for example, a method for manufacturing a semiconductor device having a MISFET.

Over a semiconductor substrate, a gate electrode is formed via a gate insulation film. By ion implantation, or the like, source/drain regions are formed. As a result, a MISFET (Metal Insulator Semiconductor Field Effect Transistor: MIS field effect transistor or MIS transistor) can be formed.

Alternatively, over a semiconductor substrate, a dummy gate electrode is formed via a gate insulation film. By ion implantation, or the like, source/drain regions are formed. Then, the dummy gate electrode is replaced with a metal gate electrode. As a result, a MISFET can also be formed.

Japanese Unexamined Patent Application Publication No. 2014-127527 (Patent Document 1), Japanese Unexamined Patent Application Publication No 2013-26466 (Patent Document 2), and Japanese Unexamined Patent Application Publication No. 2012-99517 (Patent Document 3) each describe a technology of manufacturing a MISFET having a metal gate electrode by a gate-last process. Japanese Unexamined Patent Application Publication No. 2008-41939 (Patent Document 4) describes a technology regarding a silicon anisotropic etching method.

Patent Documents

[Patent Document 1] Japanese Unexamined Patent Application Publication No. 2014-127527
[Patent Document 2] Japanese Unexamined Patent Application Publication No. 2013-26466
[Patent Document 3] Japanese Unexamined Patent Application Publication No. 2012-99517
[Patent Document 4] Japanese Unexamined Patent Application Publication No. 2008-41939

SUMMARY

A semiconductor device having a MISFET has been desired to be improved in reliability as much as possible.

Other objects and novel features will be apparent from the description of this specification and the accompanying drawings.

In accordance with one embodiment, with a method for manufacturing a semiconductor device, after forming a dummy gate electrode, a semiconductor region for source or drain of a MISFET is formed. Then, the dummy gate electrode is replaced with a gate electrode for the MISFET. When the dummy gate electrode is removed, a step of wet etching the surface of the dummy gate electrode by APM, and then, a step of removing the dummy gate electrode by wet etching using aqueous ammonia are performed.

Further, in accordance with another embodiment, with a method for manufacturing a semiconductor device, after forming a dummy gate electrode, a semiconductor region for source or drain of a MISFET is formed. Then, the dummy gate electrode is replaced with a gate electrode for the MISFET. When the dummy gate electrode is removed, a step of wet etching the surface of the dummy gate electrode by an acidic first chemical, and then, a step of removing the dummy gate electrode by wet etching using aqueous ammonia are performed.

In accordance with one embodiment, it is possible to improve the reliability of the semiconductor device.

BRIEF DESCRIPTION OF THE DRAWINGS

FIG. 17 is an essential part cross sectional view of the semiconductor device during a manufacturing step following FIG. 16;
FIG. 18 is an essential part cross sectional view of the semiconductor device during a manufacturing step following FIG. 17.

DETAILED DESCRIPTION

Figure 1:
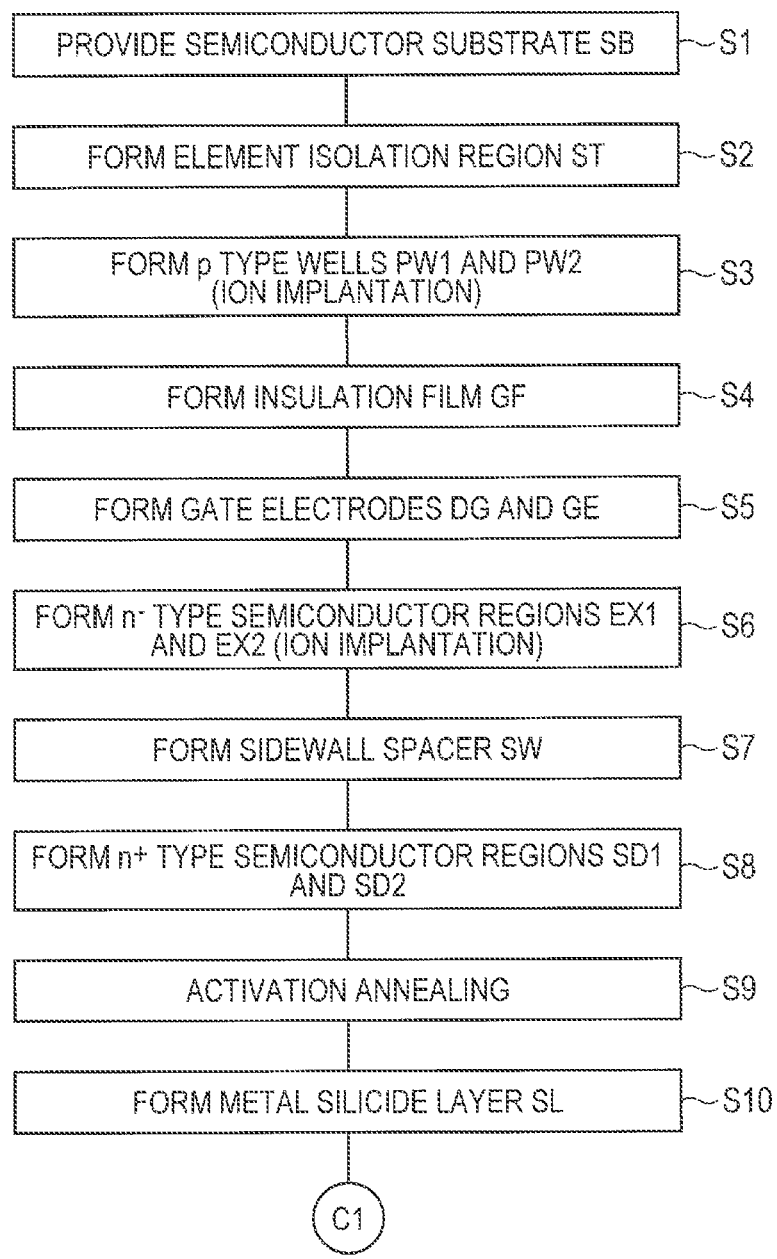
FIG. 1 is a process flowchart showing manufacturing steps of a semiconductor device of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

First Embodiment

<Regarding Manufacturing Steps of Semiconductor Device>

A method for manufacturing a semiconductor device of the present embodiment will be described by reference to the accompanying drawings. The method for manufacturing a semiconductor device of the present embodiment is a method for manufacturing a semiconductor device having a MISFET.

Figure 2:
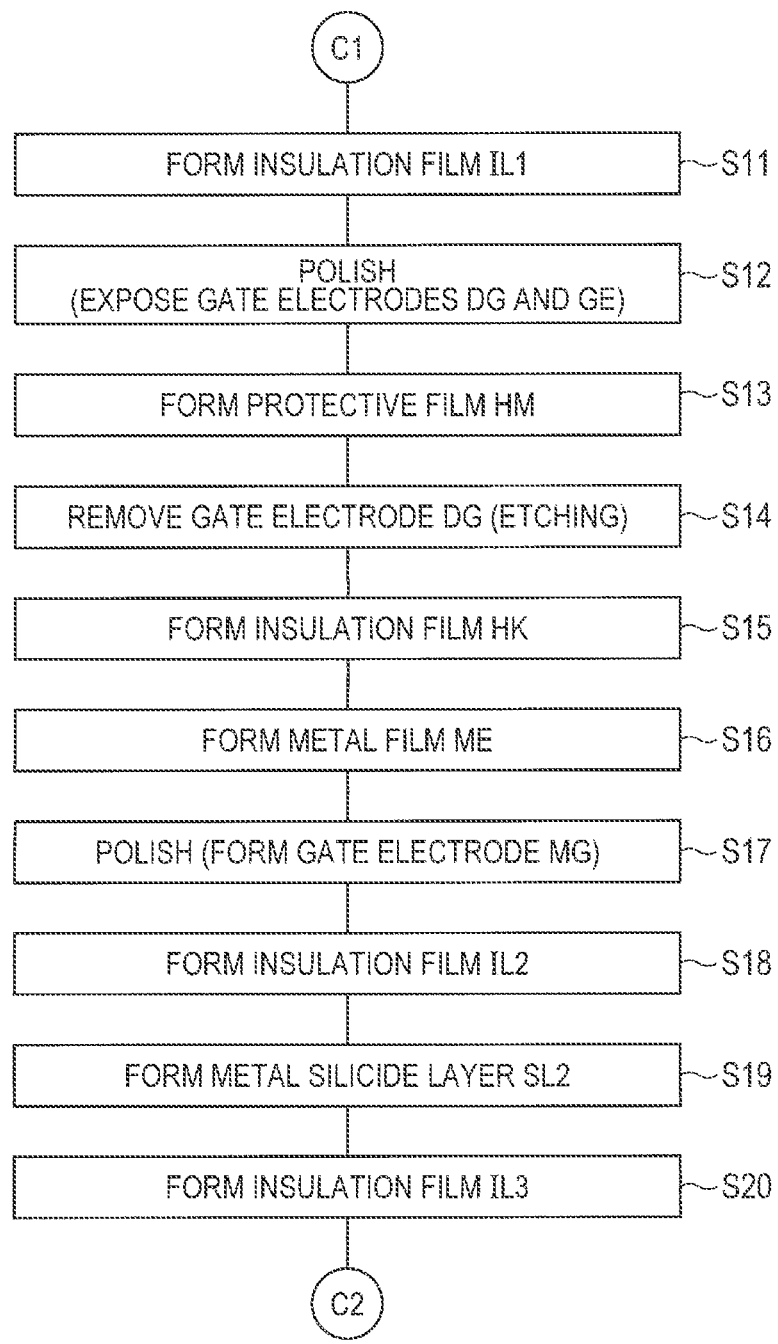
FIG. 2 is a process flowchart showing manufacturing steps of the semiconductor device following FIG. 1.
Figure 3:
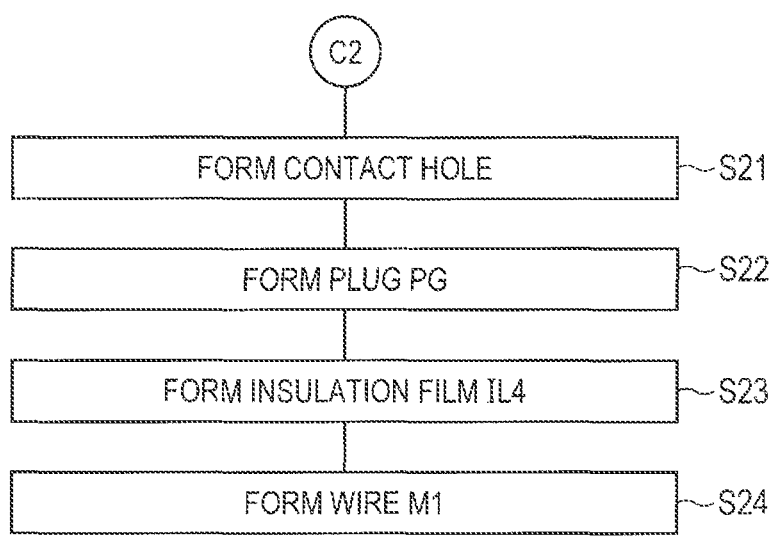
FIG. 3 is a process flowchart showing manufacturing steps of the semiconductor device following FIG. 2.

FIGS. 1 to 3 are each a process flowchart showing a manufacturing step of the semiconductor device of the present embodiment. FIGS. 4 to 26 are each an essential part cross sectional view of the semiconductor device of the present embodiment during a manufacturing step. Each cross sectional view of FIGS. 4 to 26 shows an essential part cross sectional view of a MISFET formation region 1A and a MISFET formation region 1B, and shows the manner in which MISFETs are formed in the MISFET formation region 1A and the MISFET formation region 1B, respectively.

Figure 4:
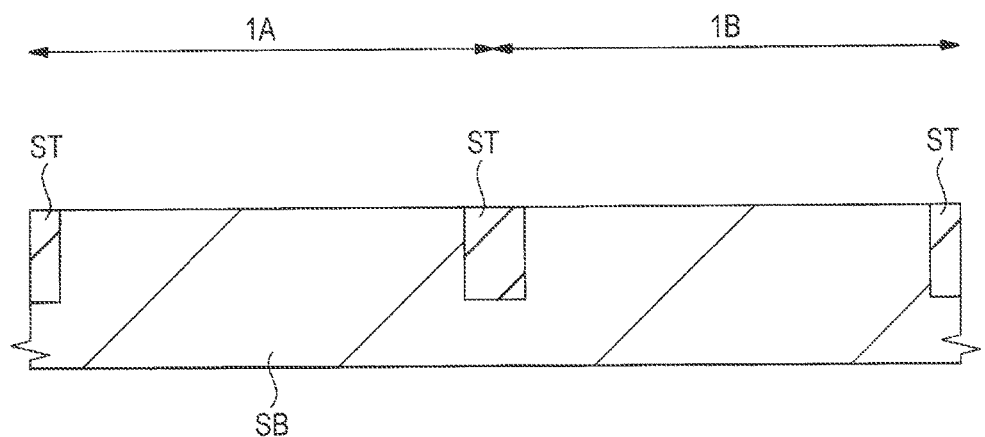
FIG. 4 is an essential part cross sectional view of the semiconductor device of one embodiment during a manufacturing step.

First, as shown in FIG. 4, a semiconductor substrate (semiconductor wafer) SB formed of, for example, a p type single crystal silicon having a specific resistance of about 1 to 10 Ωcm is prepared (provided) (Step S1 of FIG. 1). The semiconductor substrate SB has the MISFET formation region 1A and the MISFET formation region 1B.

Herein, the MISFET formation region 1A is a region in (the main surface) of the semiconductor substrate SB in which a MISFET is to be formed by a gate-last process. Whereas, the MISFET formation region 1B is a region in (the main surface) of the semiconductor substrate SB in which a MISFET is to be formed by a gate-first process. The MISFET formation region 1A and the MISFIT formation region 1B are present in the same semiconductor substrate SB. Namely, the MISFET formation region 1A and the MISFET formation region 1B correspond to mutually different planar regions of the main surface of the same semiconductor substrate SB. Incidentally, in each cross sectional view of FIGS. 4 to 26, for ease of understanding, the MISFET formation region 1A and the MISFET formation region 1B are shown adjacent to each other. However, the actual positional relationship between the MISFET formation region 1A and the MISFET formation region 1B may be changed, if required.

Then, in the main surface of the semiconductor substrate SB, element isolation regions (inter-element isolation insulation regions) ST for defining (partitioning) active regions are formed (Step S2 of FIG. 1).

The element isolation region ST is formed of an insulator such as silicon oxide, and can be formed by, for example, a STI (Shallow Trench Isolation) method, or a LOCOS (Local Oxidization of Silicon) method. For example, a trench for element isolation is formed in the main surface of the semiconductor substrate SB. Then, in the element isolating trench, an insulator formed of, for example, silicon oxide is embedded. As a result, the element isolation region ST can be formed.

The element isolation regions ST define the active region of the semiconductor substrate SB. In the active region defined by the element isolation region ST in the MISFET formation region 1A, a MISFET is formed in the manner described later. Whereas, in the active region defined by the element isolation regions ST in the MISFET formation region 1B, a MISFET is formed in the manner described later.

Figure 5:
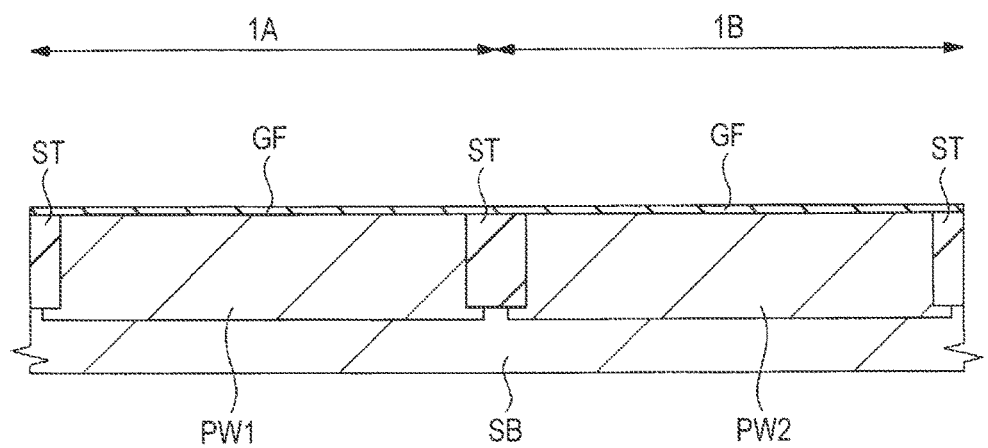
FIG. 5 is an essential part cross sectional view of the semiconductor device during a manufacturing step following FIG. 4.

Then, as shown in FIG. 5, in the semiconductor substrate SB, p type wells (p type semiconductor regions) PW1 and PW2 are formed (Step S3 of FIG. 1). The p type wells PW1 and PW2 can be formed by ion implanting a p type impurity such as boron (B) into the semiconductor substrate SB.

The p type well PW1 is formed in the semiconductor substrate SB in the MISFET formation region 1A. The p type well PW2 is formed in the semiconductor substrate SB in the MISFET formation region 1B. The p type wells PW1 and PW2 are formed from the main surface of the semiconductor substrate SB through to a prescribed depth. The p type well PW1 and the p type well PW2 are of the same conductivity type, and hence, may be formed by the same ion implantation step, or may be formed by different ion implantation steps.

Then, the surface of the semiconductor substrate SB (p type wells PW1 and PW2) is cleaned by diluted hydrofluoric acid washing, or the like. Then, at the main surface of the semiconductor substrate SB (the surfaces of of the p type wells PW1 and PW2), an insulation film GF for a gate insulation film is formed (Step S4 of FIG. 1).

The insulation film GF is formed over the surface (i.e., the top surface of the p type well PW1) of the semiconductor substrate SB in the MISFET formation region 1A, and the surface (i.e., the top surface of the p type well PW2) of the semiconductor substrate SB in the MISFET formation region 1B. As the insulation film GF, for example, a silicon oxide film can be used, and a silicon oxynitride film can also be used.

When the insulation film GF is a silicon oxide film, the insulation film GF can be formed by, for example, a thermal oxidation method. Alternatively, when the insulation film GF is a silicon oxynitride film, the insulation film GF can be formed in the following manner: a silicon oxide film is formed by, for example, a high-temperature short-time oxidation method using $N_2O$, $O_2$, and $H_2$, or a thermal oxidation method; then, a nitriding treatment (plasma nitriding) is performed in a plasma. The formed film thickness of the insulation film GF can be set at, for example, about 2 to 3 nm. Incidentally, in FIG. 5, for convenience, the insulation film GF is shown as if being also formed over the element isolation region ST. However, when the insulation film GF is formed by a thermal oxidation method, in actuality, over the element isolation region ST, the insulation film GF is not formed.

As another aspect, in Step S4, the insulation film GF in the MISFET formation region 1A, and the insulation film GF in the MISFET formation region 1B may be formed by mutually different steps. In that case, the thickness of the insulation film GF in the MISFET formation region 1A and the thickness of the insulation film GF in the MISFET formation region 1B may also be set different from each other.

Then, the gate electrodes DG and GE are formed (Step S5 of FIG. 1). The gate electrodes DG and GE formation step of Step S5 can be performed, for example, in the following manner (FIGS. 6 and 7).

Figure 6:
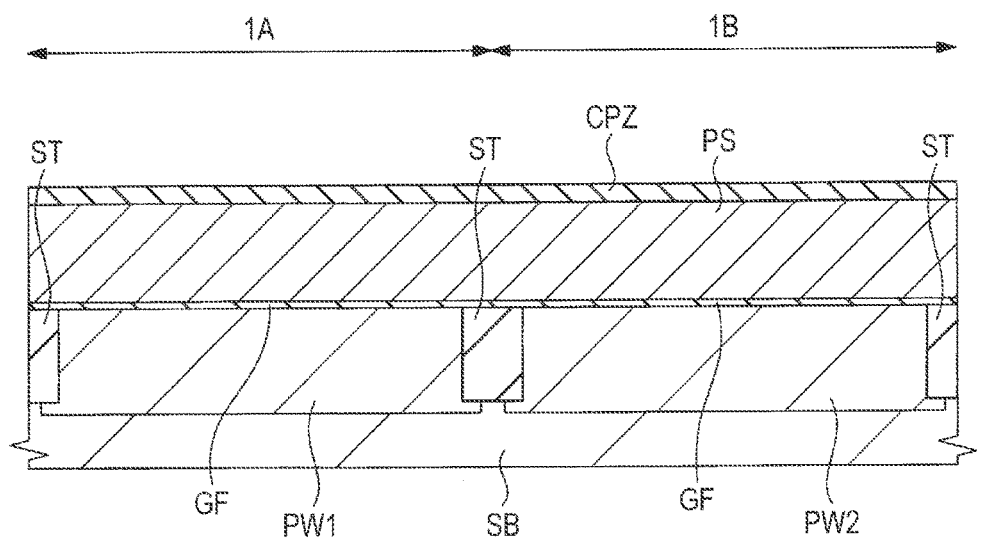
FIG. 6 is an essential part cross sectional view of the semiconductor device during a manufacturing step following FIG. 5.
Figure 7:
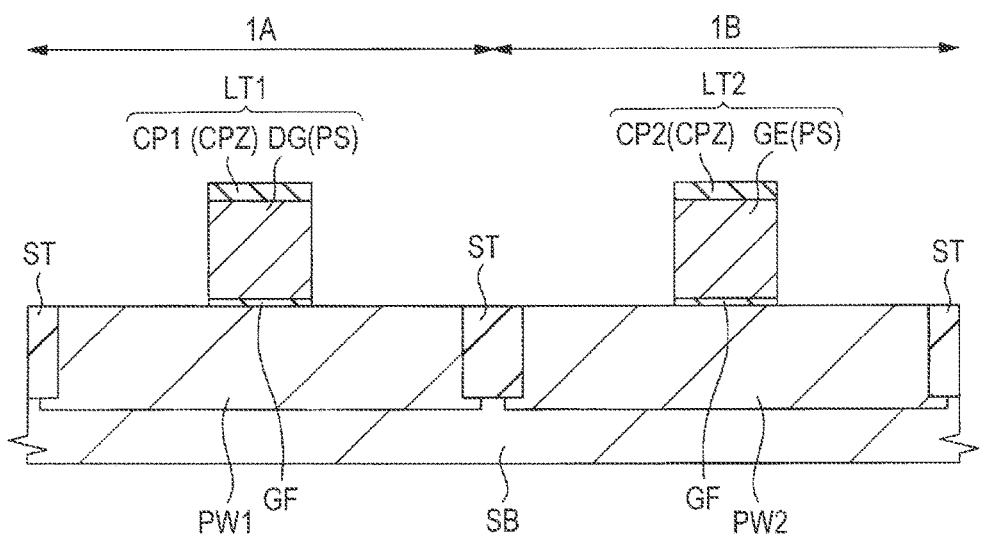
FIG. 7 is an essential part cross sectional view of the semiconductor device during a manufacturing step following FIG. 6.

Namely, first, as shown in FIG. 6, over the main surface (entire main surface) of the semiconductor substrate SB, namely, over the insulation film GF in the MISFET formation region 1A and the MISFET formation region 1B, a silicon film PS is formed (deposited).

The silicon film PS is a conductive film for forming the gate electrodes DG and GE described later. The silicon film PS forms the gate electrodes DG and GE described later. The silicon film PS is formed of a polycrystal silicon film (polysilicon film), and can be formed using a CVD (Chemical Vapor Deposition) method, or the like. The following is also possible: during deposition, the silicon film PS is formed as an amorphous silicon film; then, by the subsequent heat treatment, the silicon film PS formed of an amorphous silicon film is changed into the silicon film PS formed of a polycrystal silicon film. The silicon film PS in the MISFET formation region 1B is preferably an n type silicon film doped with an n type impurity such as phosphorus (P) or arsenic (As). The methods for doping an impurity into silicon film PS include a method in which an impurity is doped during deposition, and a method in which an impurity is doped by ion implantation after deposition. Further, the gate electrode DG described later is removed in Step S14 described later. For this reason, the silicon film PS in the MISFET formation region 1A may be doped or may not be doped with an impurity.

Then, over the silicon film PS, an insulation film CPZ is formed. The insulation film CPZ is formed of a silicon nitride film, or the like, and can be formed using a CVD method, or the like. FIG. 6 shows this stage.

Then, using a photolithography method and a dry etching method, the insulation film CPZ is patterned. Then, using the patterned insulation film CPZ as an etching mask (hard mask), the silicon film PS is dry etched, and patterned. As a result, as shown in FIG. 7, the gate electrodes DG and GE formed of the patterned silicon film PS are formed. The gate electrode DG is formed over the semiconductor substrate SB (p type well PW1) via the insulation film GF in the MISFET formation region 1A. Whereas, the gate electrode GE is formed over the semiconductor substrate SB (p type well PW2) via the insulation film GF in the MISFET formation region 1B. Over the gate electrode DG, a cap insulation film CP1 formed of the patterned insulation film CPZ is formed. Over the gate electrode GE, a cap insulation film CP2 formed of the patterned insulation film CPZ is formed. The cap insulation film CP1 has almost the same planar shape as that of the gate electrode DG. The cap insulation film CP2 has almost the same planar shape as that of the gate electrode GE.

In this manner, the gate electrodes DG and GE formation step of Step S5 is performed.

Further, the portion of the insulation film GF not covered with the gate electrodes DG and GE may be removed by dry etching for patterning the silicon film PS, the subsequent wet etching, or the like.

The lamination structure of the gate electrode DG and the cap insulation film CP1 formed in the MISFET formation region 1A is assumed to be herein referred to as a lamination body LT1 below. Whereas, the lamination structure of the gate electrode GE and the cap insulation film CP2 formed in the MISFET formation region 1B is assumed to be referred to as a lamination body LT2 below. The lamination body LT1 is formed over the semiconductor substrate SB (p type well PW1) via the insulation film GF in the MISFET formation region 1A. The lamination body LT2 is formed over the semiconductor substrate SB (p type well PW2) via the insulation film GF in the MISFET formation region 1B.

Further, the gate electrode DG is a dummy gate electrode (pseudo gate electrode), and is removed later.

Figure 8:
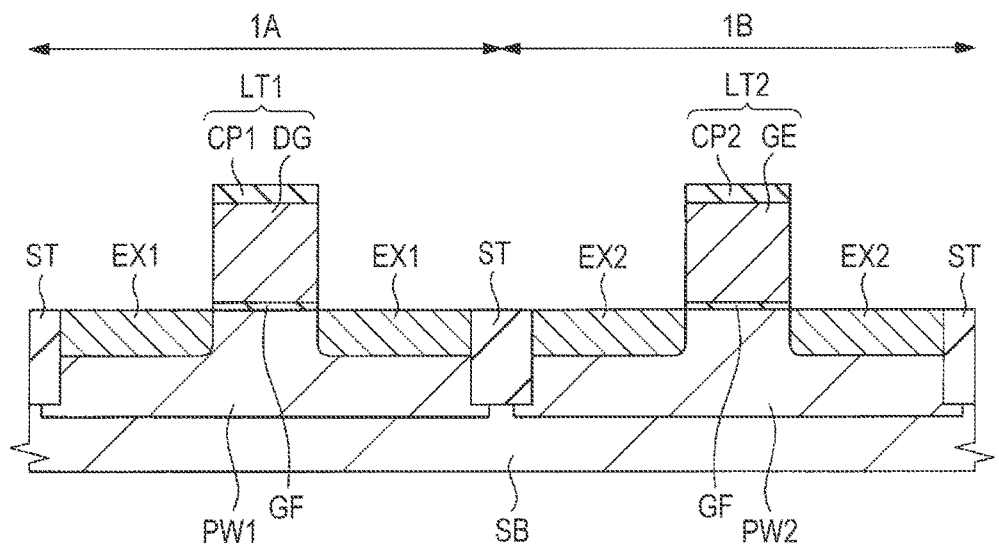
FIG. 8 is an essential part cross sectional view of the semiconductor device during a manufacturing step following FIG. 7.

Then, as shown in FIG. 8, n⁻ type semiconductor regions (n type impurity diffusion layers, extension regions, or LDD regions) EX1 and EX2 are formed using an ion implantation method (Step S6 of FIG. 1).

In Step S6, an n type impurity such as arsenic (As) or phosphorus (P) is doped into the semiconductor substrate SB (p type wells PW1 and PW2) using the lamination body LT1 and the lamination body LT2 as a mask (ion implantation inhibiting mask) by an ion implantation method. As a result, the n⁻ type semiconductor regions EX1 and EX2 can be formed. At this step, in the MISFET formation region 1A, the lamination body LT1 functions as a mask (ion implantation inhibiting mask). As a result, the n⁻ type semiconductor regions EX1 are formed in the regions on the opposite sides of the lamination body LT1 in the semiconductor substrate SB (p type well PW1). Whereas, in the MISFET formation region 1B, the lamination body LT2 functions as a mask (ion implantation inhibiting mask). As a result, the n⁻ type semiconductor regions EX2 are formed in the regions on the opposite sides of the lamination body LT2 in the semiconductor substrate SB (p type well PW2).

The n⁻ type semiconductor region EX1 can function as a part of the source/drain region (source or drain region) of the MISFET formed in the MISFET formation region 1A. Whereas, the n⁻ type semiconductor region EX2 can function as a part of the source/drain region (source or drain region) of the MISFET formed in the MISFET formation region 1B. The n⁻ type semiconductor region EX1 and the n⁻ type semiconductor region EX2 can be formed by the same ion implantation step, and may also be formed by different ion implantation steps.

Figure 9:
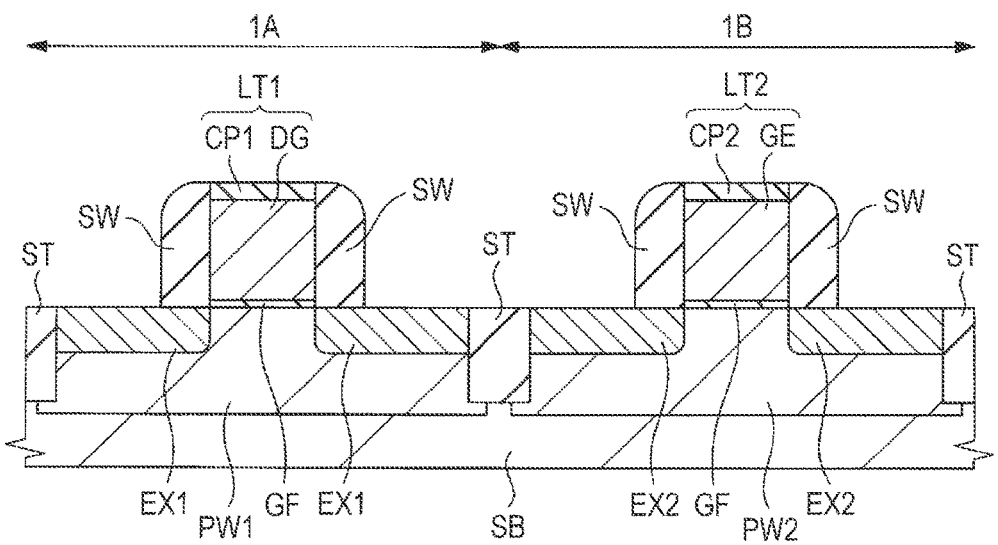
FIG. 9 is an essential part cross sectional view of the semiconductor device during a manufacturing step following FIG. 8.

Then, as shown in FIG. 9, sidewall spacers SW are formed as sidewall insulation films over respective opposite side surfaces of the lamination bodies LT1 and LT2 (Step S7 of FIG. 1). The sidewall spacer SW formation step can be performed in the following manner.

Namely, first, entirely over the main surface of the semiconductor substrate SB, an insulation film for forming the sidewall spacers SW is deposited in such a manner as to cover the lamination bodies LT1 and LT2 using a CVD method, or the like. The sidewall spacer SW forming insulation film is formed of, for example, a silicon oxide film or a silicon nitride film, or a lamination film thereof. Then, the sidewall spacer SW forming insulation film is anisotropically etched (etched back). As a result, as shown in FIG. 9, over the opposite side surfaces of the lamination body LT1, and over the opposite side surfaces of the lamination body LT2, the insulation film (sidewall spacer SW forming insulation film) are left, thereby to form the sidewall spacers SW.

Figure 10:
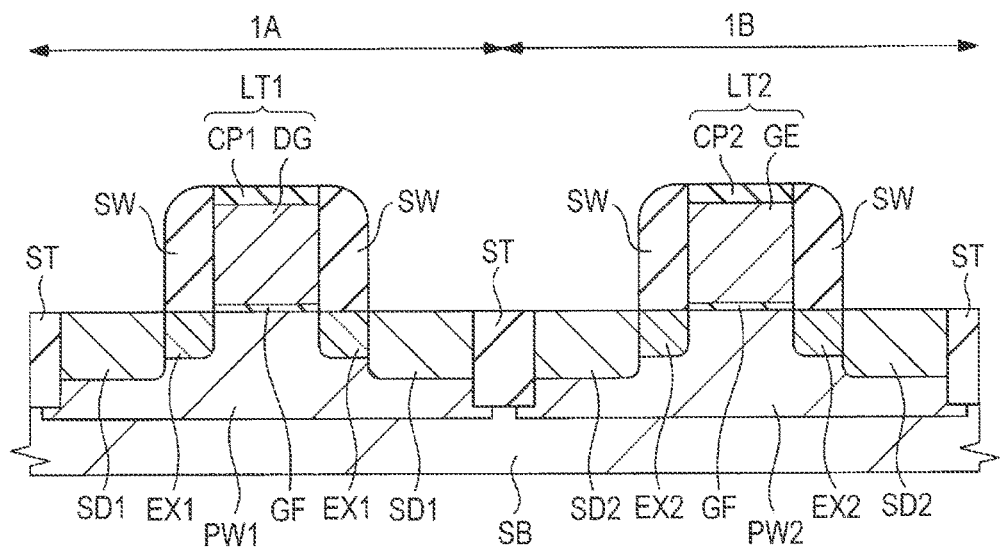
FIG. 10 is an essential part cross sectional view of the semiconductor device during a manufacturing step following FIG. 9.

Then, as shown in FIG. 10, n⁺ type semiconductor regions (n type impurity diffusion layers, or source/drain regions) SD1 and SD2 are formed using an ion implantation method (Step S8 of FIG. 1).

In Step S8, an n type impurity such as arsenic (As) or phosphorus (P) is ion implanted into the semiconductor substrate SB (p type wells PW1 and PW2) using the lamination body LT1 and the lamination body LT2, and the sidewall spacers SW over their respective sidewalls as a mask (ion implantation inhibiting mask). As a result, the $n_+$ type semiconductor regions SD1 and SD2 can be formed. At this step, in the MISFET formation region 1A, the lamination body LT1, and the sidewall spacers SW over the opposite side surfaces thereof function as a mask (ion implantation inhibiting mask). As a result, the n⁺ type semiconductor regions SD1 are formed in the regions on the opposite sides of a structure formed of the lamination body LT1, and the sidewall spacers SW over the opposite side surfaces thereof in the semiconductor substrate SB (p type well PW1), Whereas, in the MISFET formation region 1B, the lamination body LT2, and the sidewall spacers SW over the opposite side surfaces thereof function as a mask (ion implantation inhibiting mask). As a result, the n⁺ type semiconductor regions SD2 are formed in the regions on the opposite sides of a structure formed of the lamination body LT2, and the sidewall spacers SW over the opposite side surfaces thereof in the semiconductor substrate SB (p type well PW2). This results in the formation of a LDD (Lightly doped Drain) structure. The n⁺ type semiconductor region SD1 and the n⁺ type semiconductor region SD2 can be formed by the same ion implantation step, and can also be formed by different ion implantation steps.

In this manner, in the semiconductor substrate SB (p type well PW1) in the MISFET formation region 1A, the n⁻ type semiconductor region EX1, and the n⁺ type semiconductor region SD1 having a higher impurity density than that form an n type semiconductor region functioning as the source/drain region (the semiconductor region for source or drain) of the MISFET. Whereas, in the semiconductor substrate SB (p type well PW2) in the MISFET formation region 1B, the n⁻ type semiconductor region EX2, and the n⁺ type semiconductor region SD2 having a higher impurity density than that form an n type semiconductor region functioning as the source/drain region (the semiconductor region for source or drain) of the MISFET. The n⁺ type semiconductor region SD1 is higher in impurity density, and deeper in junction depth than the n⁻ type semiconductor region EX1. The n⁺ type semiconductor region SD2 is higher in impurity density, and deeper in junction depth than the n⁻ type semiconductor region EX2.

Then, activating annealing is performed which is a heat treatment for activating the impurities doped up to this point (the impurities doped into the n⁻ type semiconductor regions EX1 and EX2, and the n⁺ type semiconductor regions SD1 and SD2, and the like) (Step S9 of FIG. 1).

In this manner, in the MISFET formation region 1B, the gate electrode GE and the source/drain region of the MISFET were formed, and in the MISFET formation region 1A, the source/drain region of the MISFET were formed. However, in the MISFET formation region 1A, a gate electrode to be used finally (gate electrode MG described later) has not been formed yet.

Then, a metal silicide layer SL is formed (Step S10 of FIG. 1).

The metal silicide layer SL can be formed by performing a so-called Salicide: Self Aligned Silicide process. Specifically, the metal silicide layer SL can be formed in the following manner.

Figure 11:
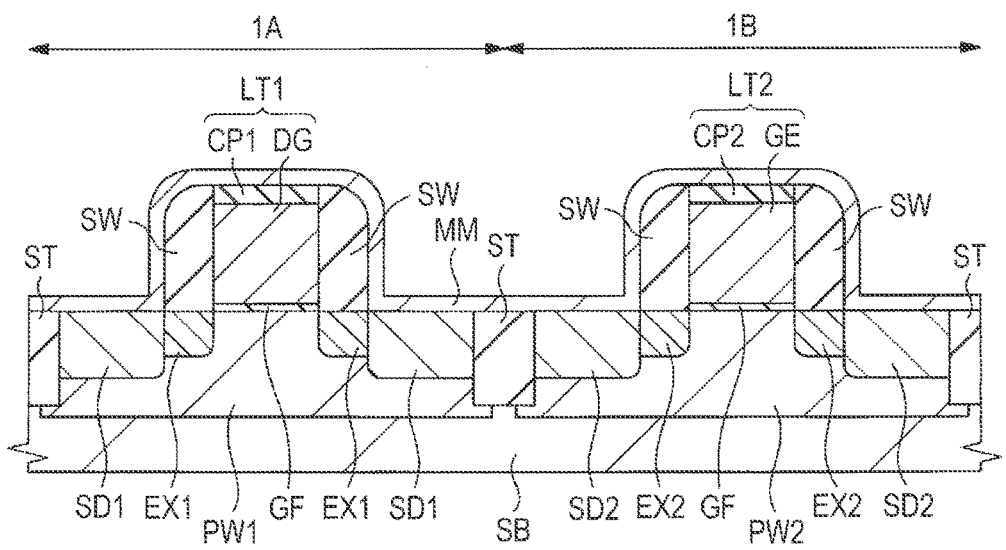
FIG. 11 is an essential part cross sectional view of the semiconductor device during a manufacturing step following FIG. 10.
Figure 12:
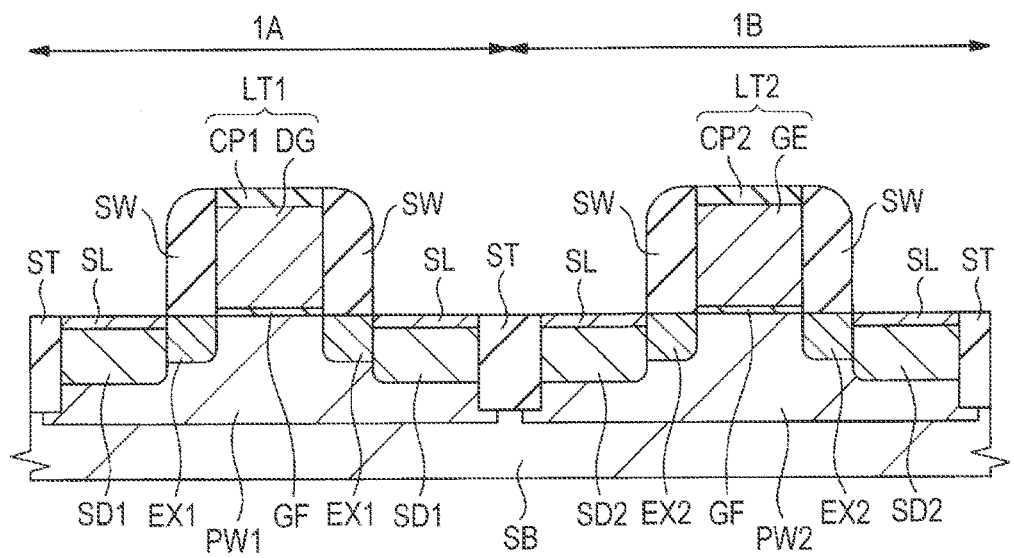
FIG. 12 is an essential part cross sectional view of the semiconductor device during a manufacturing step following FIG. 11.

Namely, first, as shown in FIG. 11, entirely over the main surface of the semiconductor substrate SB including over the top surfaces (front surfaces) of the n⁺ type semiconductor regions SD1 and SD2, a metal film MM for forming the metal silicide layer SL is formed (deposited) in such a manner as to cover the lamination bodies LT1 and LT2, and the sidewall spacers SW. For the metal film MM, a simple-substance metal film (pure metal film), or an alloy film can be used. The metal film MM is formed of, for example, a cobalt (Co) film, a nickel (Ni) film, or a nickel platinum alloy film, and can be formed using a sputtering method, or the like. Then, the semiconductor substrate SB is subjected to a heat treatment (heat treatment for forming the metal silicide layer SL). As a result, respective upper layer portions of the n⁺ type semiconductor regions SD1 and SD2 are allowed to react with the metal film MM. As a result, as shown in FIG. 12, the metal silicide layers SL are formed at respective tops (upper layer parts) of the n$^+$ type semiconductor regions SD1 and SD2, respectively. Subsequently, the unreacted portions of the metal film MM are removed by wet etching, or the like. FIG. 12 shows a cross sectional view at this stage, Alternatively, after removing the unreacted portions of the metal film MM, a heat treatment can also be further performed. When the metal film MM is a cobalt film, the metal silicide layer SL is formed of a cobalt silicide layer. When the metal film MM is a nickel film, the metal silicide layer SL is formed of a nickel silicide layer. When the metal film MM is a nickel platinum alloy film, the metal silicide layer SL is formed of a platinum-doped nickel silicide layer.

Thus, by performing a so-called silicide process, the metal silicide layers SL are formed at respective tops of the n$^+$ type semiconductor regions SD1 and SD2. As a result, the resistance of the source or the drain can be reduced.

Further, in the present embodiment, a cap insulation film CP1 is formed over the gate electrode DG, and a cap insulation film CP2 is formed over the gate electrode GE. Accordingly, the metal silicide layer SL is not formed over the gate electrodes DG and GE.

Figure 13:
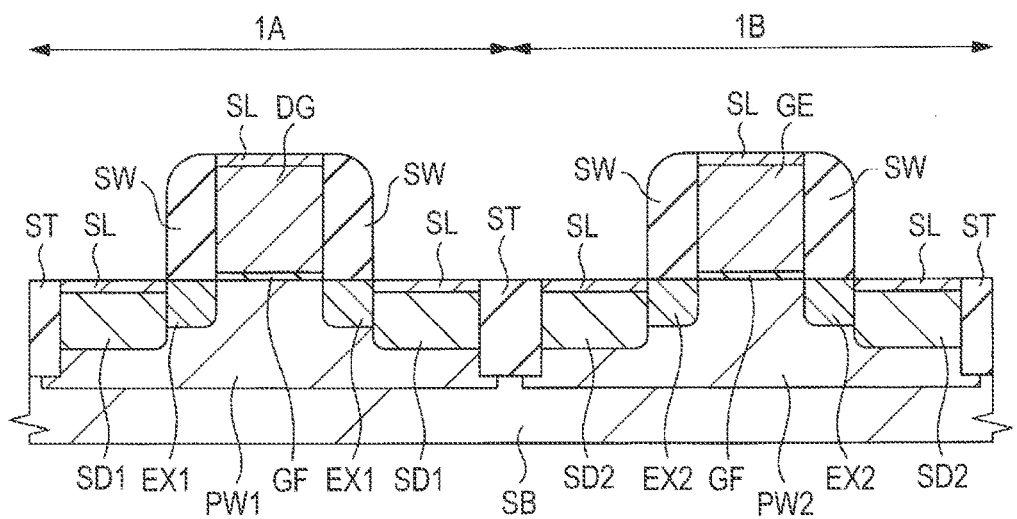
FIG. 13 is an essential part cross sectional view during the same manufacturing step as that of FIG. 12 when a cap insulation film is omitted.

As another aspect, the formation of the cap insulation films CP1 and CP2 can be omitted. In that case, after forming the silicon film PS, the silicon film PS is patterned without performing the insulation film CPZ formation step. As a result, the gate electrodes DG and GE are formed. When the formation of the cap insulation films CP1 and CP2 is omitted, in the description in conjunction with the steps (Steps S6 to S10) of FIGS. 8 to 12, the "lamination body LT1" may be read as "gate electrode DG", and the "lamination body LT2" may be read as "gate electrode GE". When the formation of the cap insulation films CP1 and CP2 is omitted, upon performing Step S10 (metal silicide layer SL formation step), as shown in not FIG. 12 but FIG. 13, the metal silicide layers SL are formed not only at respective tops of the n$^+$ type semiconductor regions SD1 and SD2 but also at respective tops of the gate electrodes DG and GE. Herein, FIG. 13 is an essential part cross sectional view showing the stage upon performing Step S10 when the cap insulation films CP1 and CP2 have not been formed, and corresponds to the same step stage as that of FIG. 12. However, even when the metal suicide layers SL have been formed at respective tops of the gate electrodes DG and GE in Step S10 as in FIG. 13, the metal silicide layers SL at respective tops of the gate electrodes DG and GE are removed by the polishing step of Step S12 described later.

Figure 14:
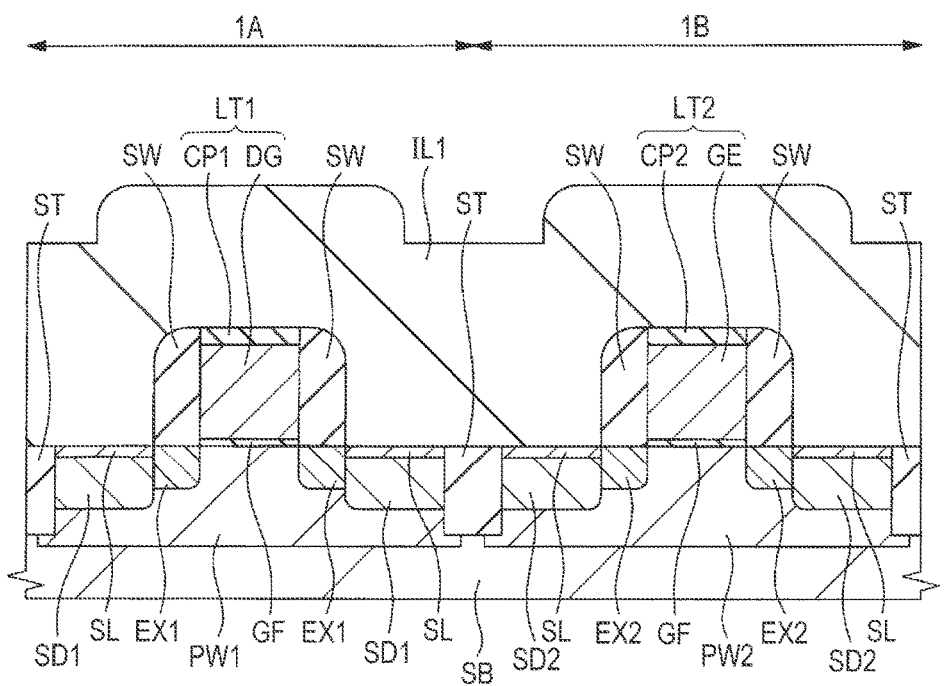
FIG. 14 is an essential part cross sectional view of the semiconductor device during a manufacturing step following FIG. 12.

Then, as shown in FIG. 14, entirely over the main surface of the semiconductor substrate SB, an insulation film (interlayer insulation film) IL1 is formed (deposited) as an interlayer insulation film in such a manner as to cover the lamination bodies LT1 and LT2 (gate electrodes DG and GE) and the sidewall spacers SW (Step S11 of FIG. 2).

The insulation film IL1 is formed of a single film of a silicon oxide film, a lamination film of a silicon nitride film, and a silicon oxide film formed over the silicon nitride film, and thicker than the silicon nitride film, or the like, and can be formed using, for example, a CVD method.

Then, the top surface of the insulation film IL1 is polished using a CMP (Chemical Mechanical Polishing) method, or the like (Step S12 of FIG. 2).

Figure 15:
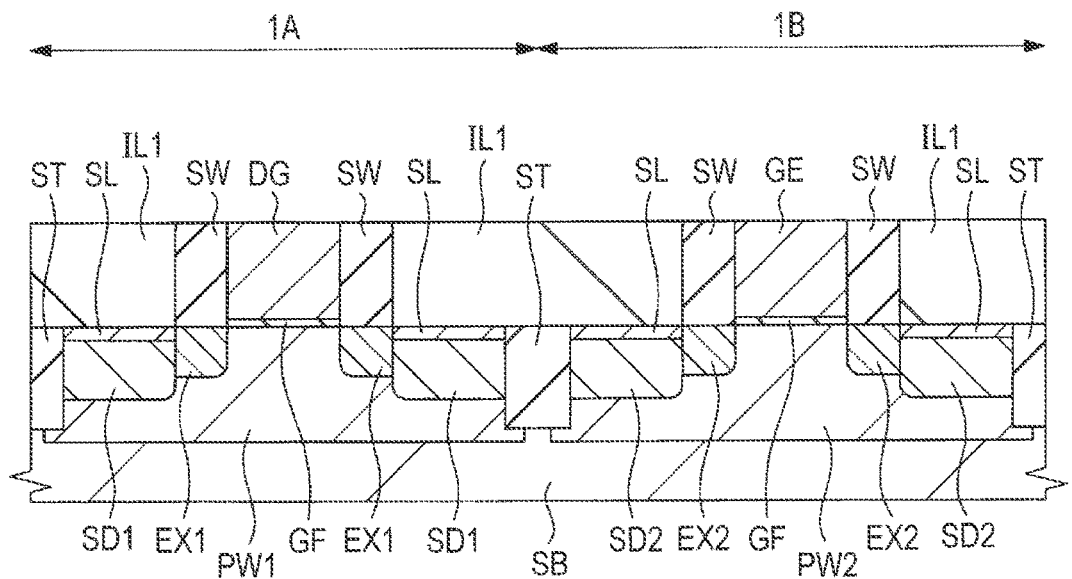
FIG. 15 is an essential part cross sectional view of the semiconductor device during a manufacturing step following FIG. 14.

By the polishing step of Step S12, as shown in FIG. 15, respective top surfaces of the gate electrode DG and the gate electrode GE are exposed. Namely, the polishing step of Step S12 is performed until respective top surfaces of the gate electrode DG and the gate electrode GE are exposed. It is often desirable to add overpolishing that polishing is continued for a given time even after the gate electrode is partially exposed so as to expose the gate electrode entirely at the surface of the wafer (semiconductor substrate SB). Overpolishing can be applied during a proper time within such a range as not to excessively polish the gate electrode.

When the cap insulation films CP1 and CP2 have been formed over the gate electrodes DG and GE, the polishing step of Step S12 polishes and removes not only the insulation film IL1, but also the cap insulation films CP1 and CP2. As a result, respective top surfaces of the gate electrode DG and the gate electrode GE are exposed.

Whereas, when the cap insulation films CP1 and CP2 have not been formed over the gate electrodes DG and GE, as in FIG. 13, the metal silicide layers SL are formed at respective tops of the gate electrodes DG and GE in Step S10. In that case, the polishing step of Step S12 polishes and removes not only the insulation film IL1, but also the metal silicide layers SL at respective tops of the gate electrodes DG and GE. As a result, respective top surfaces of the gate electrode DG and the gate electrode GE are exposed. Accordingly, in both of the case where the structure of FIG. 12 is obtained upon performing Step S10, and the case where the structure of FIG. 13 is obtained upon performing Step S10, performing of the polishing step of Step S12 results in exposure of respective top surfaces (silicon surfaces) of the gate electrode DG and the gate electrode GE. As a result, the structure of FIG. 15 is obtained.

In either case, performing of the polishing step of Step S12 results in exposure of respective top surfaces of the gate electrode DG and the gate electrode GE.

Further, in order to prevent the generation of the polishing residue of the metal film ME in the polishing step of Step S17 described later, the polishing step of Step S12 is desirably performed so as to sufficiently ensure the flatness of the top surface of the insulation film IL1 after polishing, and so as to suppress dishing in the insulation film IL1.

Then, such a protective film (mask layer) HM as to cover the gate electrode GE, and as not to cover and as to expose the gate electrode DG is formed over the insulation film IL1 (Step S13 of FIG. 2). The protective film HM formation step of Step S13 can be performed, for example, in the following manner (FIGS. 16 and 17).

Figure 16:
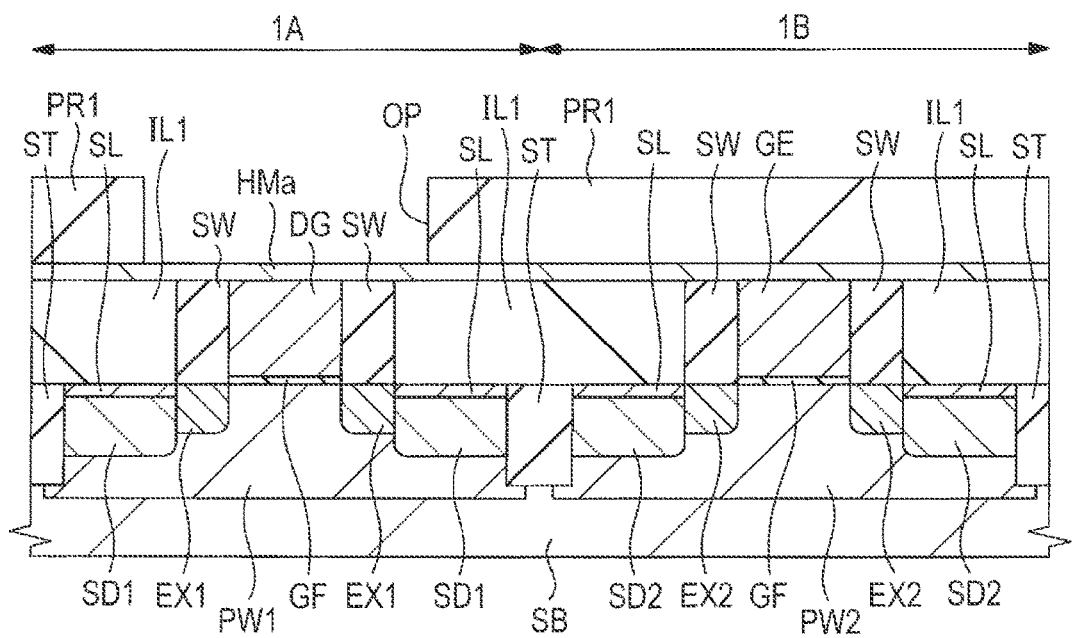
FIG. 16 is an essential part cross sectional view of the semiconductor device during a manufacturing step following FIG. 15.

Namely, first, as shown in FIG. 16, over the semiconductor substrate SB, namely, over the insulation film IL1, a material film HMa for forming the protective film HM is formed in such a manner as to cover the gate electrode DG and the gate electrode GE. Then, over the material film HMa, using a photolithography technology, a photoresist pattern PR1 is formed. The photoresist pattern PR1 has an opening OP internally including the gate electrode DG in a plan view. The opening OP does not overlap the gate electrode GE in a plan view. Then, using the photoresist pattern PR1 as an etching mask, the portion of the material film HMa exposed from the opening OP of the photoresist pattern PR1 is etched and removed. As a result, the material film HMa is patterned, resulting in a protective film HM. Then, the photoresist pattern PR1 is removed. FIG. 17 shows this stage. The polishing step of Step S12 exposed the gate electrode DG and the gate electrode GE as shown in FIG. 15. However, the formation of the protective film HM results in the following state: as shown in FIG. 17, the top surface of the gate electrode DG is not covered with the protective film HM, and is exposed, and the gate electrode GE is covered with the protective film HM, and is not exposed. For this reason, the protective film HM can be regarded as a mask layer covering the gate electrode GE, and exposing the gate electrode DG.

Further, in order that the gate electrode DG is removed, but the gate electrode GE is not removed in Step S14 described later, such a protective film HM as to cover the gate electrode GE and as to expose the gate electrode DG is formed in Step S13. Namely, the protective film HM functions as a mask layer (hard mask) in Step S14 described later. As the materials for the protective film HM (material film HMa), mention may be made of metal materials (metal compound materials showing metal conduction) or insulating materials. The material for the protective film HM is preferably a material which is less likely to be etched when the gate electrode DG is removed in Step S14 described later, and is preferably a material which tends to be polished in the polishing step of Step S17 described later. When a great importance is placed on the ease of polishing in the polishing step of Step S17 described later, a titanium nitride (TiN) film can be preferably used as the protective film HM. When a titanium nitride (TiN) film is used as the protective film HM, as the material film HMa, a titanium nitride (TiN) film is used. The titanium nitride (TiN) film can be formed using, for example, a PVD (Physical Vapor Deposition) method.

Herein, a description will be given to the case where a titanium nitride film is used as the material film HMa. In this case, the film thickness (formed film thickness) of the titanium nitride film can be set at, for example, about 15 nm so as to facilitate etching of the titanium nitride film (material film HMa) using the photoresist pattern PR1 as an etching mask. Further, when the titanium nitride film (material film HMa) is etched using the photoresist pattern PR1 as an etching mask, wet etching using HPM (Hydrochloric acid—Hydrogen Peroxide Mixture) as an etchant can be preferably used. The concentration ratio (volume mixing ratio) of the etchant at that step can be set at, for example, $HCl:H_2O_2:H_2O$=about 1:4:200. The temperature of the etchant can be set at, for example, about 70° C. The etching rate of the titanium nitride film (material film HMa) can be set at, for example, about 0.02 nm/sec. The etching time can be set at, for example, about 1000 to 1500 seconds including the overetching time. Further, using the photoresist pattern PR1 as an etching mask, the titanium nitride film (material film HMa) is etched, thereby to form the protective film HM. Then, the photoresist pattern PR1 is removed. The photoresist removing processes include two ways of an ashing treatment of a dry process, and a wet treatment using high-temperature SPM (Sulfuric acid—Hydrogen Peroxide Mixture). However, use of SPM may remove the titanium nitride film (protective film HM). For this reason, the photoresist pattern PR1 is preferably removed by an ashing treatment by oxygen plasma so as to prevent the titanium nitride film (protective film HM) from being removed. Incidentally, HPM is a mixed solution of hydrochloric acid, hydrogen peroxide, and water. SPM is a mixed solution of sulfuric acid, hydrogen peroxide, and water.

Then, as shown in FIG. 18, the gate electrode DG is removed by etching (Step S14 of FIG. 2).

The etching step of the gate electrode DG of Step S14 is performed by wet etching. Further, for the etching step of the gate electrode DG of Step S14, etching is preferably performed under the conditions under which the insulation film IL1, the sidewall spacers SW, and the insulation film GF are less likely to be etched than the gate electrode DG. Namely, under the conditions of high etching selectivity under which each etching rate of the insulation film IL1, the sidewall spacers SW, and the insulation film GF is smaller than the etching rate of the gate electrode DG, the gate electrode DG is preferably etched. As a result, in the etching step of the gate electrode DG of Step S14, the gate electrode DG can be selectively etched. The gate electrode DG is formed of silicon (polysilicon). For this reason, it becomes easier to ensure a high etching selectivity of the gate electrode DG in Step S14.

Further, in Step S14, the gate electrode DG has not been covered with the protective film HM, and has been exposed, and hence is etched, and removed. However, the gate electrode GE has been covered with the protective film HM, and has not been exposed, and hence is not etched, and remains as it is.

In Step S14, the gate electrode DG has been removed, thereby to form a trench (concave part, or pit part) TR. The trench TR is a region from which the gate electrode DG was removed, and corresponds to the region in which the gate electrode DG has been present until removal of the gate electrode DG in Step S14. The bottom surface of the trench TR is formed of the top surface of the insulation film GF. The sidewall (side surface) of the trench TR is formed of the side surface of the sidewall spacer SW (the side surface which has been in contact with the gate electrode DG until before the removal of the gate electrode DG). At the bottom of the trench TR, preferably, the semiconductor substrate SB is not exposed, and the insulation film GF remains in a layer form.

In Step S14, upon complete removal of the insulation film GF at the bottom of the trench TR, the semiconductor substrate SB formed of the same material (herein, silicon) as that for the gate electrode DG to be removed is exposed at the bottom of the trench TR. Accordingly, unintended excessive etching of the semiconductor substrate SB may be caused at the bottom of the trench TR. For this reason, preferably, the etching step of Step S14 is completed before exposure of the semiconductor substrate SB at the bottom of the trench TR, and the insulation film GF is left in a layer form at the bottom of the trench TR. For this reason, for the etching step of Step S14, the etching conditions are required to be set so that the gate electrode DG can be removed with reliability, and so that the insulation film GF of the base of the gate electrode DG is left in a layer form without being completely removed.

Incidentally, although described in details later, in Step S14, only wet etching using a single etchant is not performed. Namely, in the case of the present embodiment, in Step S14, first, the step (Step S14a described later) of wet etching the surface of the gate electrode DG by APM is performed. Then, the step (Step S14b described later) of removing the gate electrode DG by wet etching using aqueous ammonia is performed. Whereas, in the case of Second Embodiment described later, in Step S14, first, the step (Step S14c described later) of wet etching the surface of the gate electrode DG by an acid type chemical is performed. Then, the step (Step S14d described later) of removing the gate electrode DG by wet etching using aqueous ammonia is performed. These will be described in more details later.

Figure 19:
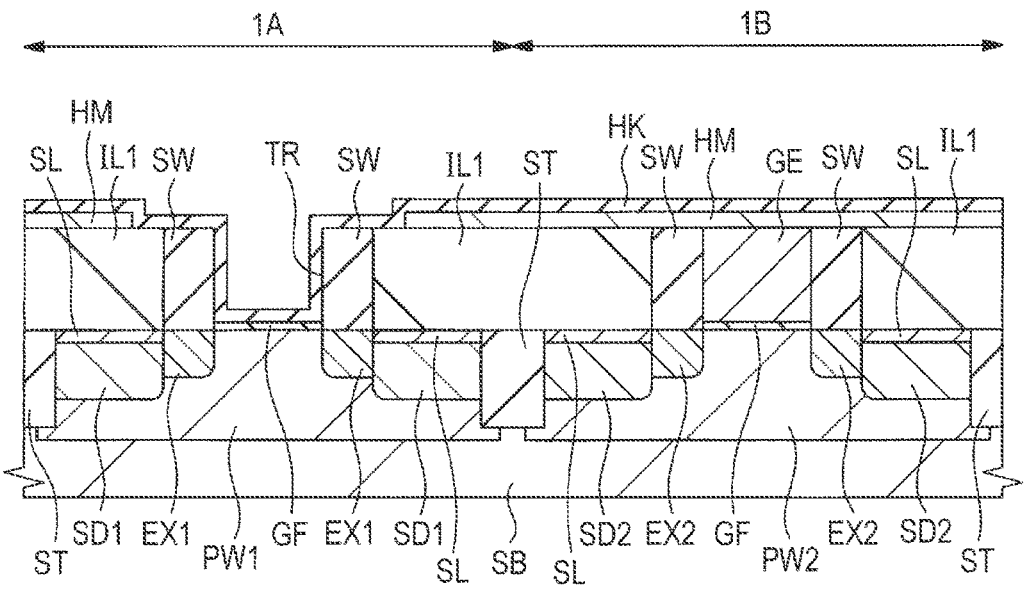
FIG. 19 is an essential part cross sectional view of the semiconductor device during a manufacturing step following FIG. 18.
Figure 20:
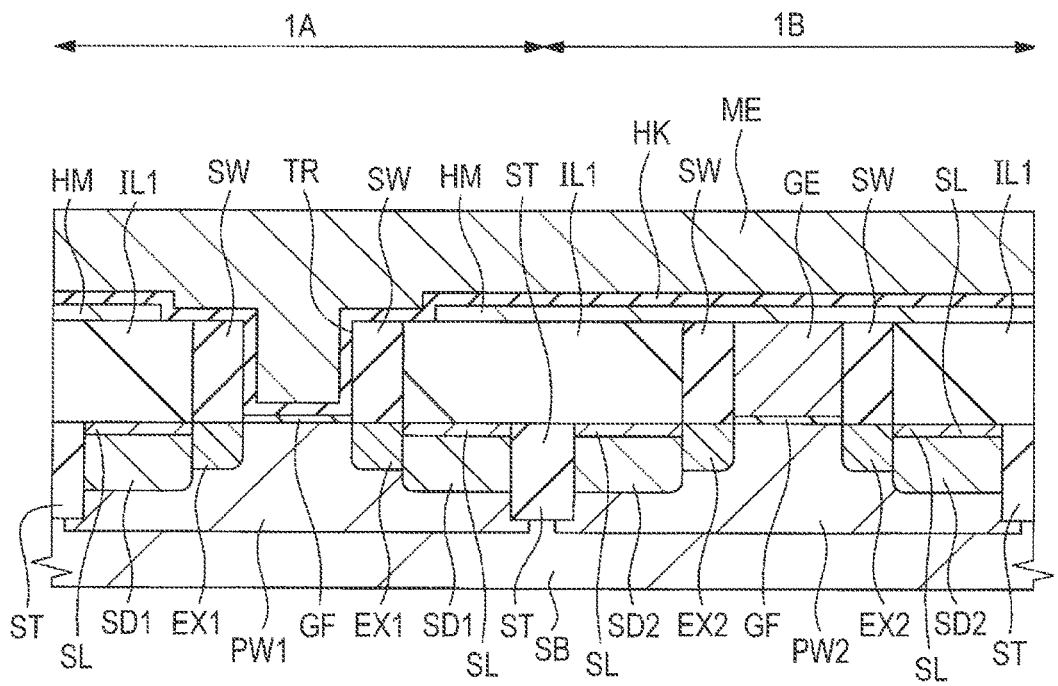
FIG. 20 is an essential part cross sectional view of the semiconductor device during a manufacturing step following FIG. 19.

Then, as shown in FIG. 19, over the semiconductor substrate SB, namely, over the insulation film IL1 and the protective film HM including over the inner surface (the bottom surface and the sidewall) of the trench TR, an insulation film HK is formed (Step S15 of FIG. 2). Then, as shown in FIG. 20, over the semiconductor substrate SB, namely, over the insulation film HK, a metal film (conductive film) ME is formed as a conductive film for forming a metal gate electrode in such a manner as to fill the inside of the trench TR (Step S16 of FIG. 2).

In the trench TR, in Step S15, the insulation film HK is formed over the bottom surface and the sidewall (side surface) of the trench TR. However, the trench TR is not fully filled with the insulation film HK. The formation of the metal film ME in Step S16 results in the state in which the trench TR is fully filled with the insulation film HK and the metal film ME.

The insulation film HK is the insulation film for the gate insulation film of a MISFET formed in the MISFET formation region 1A. The metal film ME is a conductive film for the gate electrode of the MISFET formed in the MISFET formation region 1A.

The insulation film HK is an insulating material film having a higher dielectric constant (relative dielectric constant) than that of silicon nitride, a so-called High-k film (high dielectric constant film). Incidentally, in the present application, the term "High-k film", "high dielectric constant film", "high dielectric constant insulation film", or "high dielectric constant gate insulation film" denotes a film having a higher dielectric constant (relative dielectric constant) than that of silicon nitride.

As the insulation film HK, a metal oxide film such as a hafnium oxide film, a zirconium oxide film, an aluminum oxide film, a tantalum oxide film, or a lanthanum oxide film can be used. Further, the metal oxide film may also further contain one or both of nitrogen (N) and silicon (Si). The insulation film HK can be formed by, for example, an ALD (Atomic layer Deposition) method or a CVD method. When a high dielectric constant film (herein, the insulation film HK) is used as the gate insulation film, the physical film thickness of the gate insulation film can be increased than when a silicon oxide film is used as the gate insulation film. This can provide advantages of allowing the improvement of the driving ability of a transistor, and the reduction of the leakage current between the gate electrode and the substrate.

As the metal film ME, there can be used a metal film such as a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film, or an aluminum (Al) film. Incidentally, the metal film herein referred to denotes a conductive film showing metal conduction, and is assumed to include not only a simple-substance metal film (pure metal film), or an alloy film, but also a metal compound film (such as a metal nitride film or a metal carbide film) showing metal conduction. For this reason, the metal film ME is a conductive film showing metal conduction, is not limited to a simple-substance metal film (pure metal film) or an alloy film, and may be a a metal compound film (such as a metal nitride film or a metal carbide film) showing metal conduction. Alternatively, the metal film ME may be a lamination film (lamination film of a plurality of stacked films). However, in that case, the bottom layer of the lamination film is set to be a metal film (conductive film showing metal conduction). Still alternatively, the lamination film may also be set to be a lamination film of a plurality of metal films (conductive films showing metal conduction). The metal film ME can be formed using, for example, a sputtering method.

As one preferable example of the metal film ME, the metal film ME may be set to be a lamination film of a titanium nitride (TiN) film, and an aluminum (Al) film over the titanium nitride film. In this case, first, over the insulation film HK, for example, an about 2- to 3-nm titanium nitride film is formed. Then, over the titanium nitride film, an aluminum film is formed in such a manner as to fill the inside of the trench TR. At this step, preferably, the aluminum film is set thicker than the titanium nitride film. The aluminum film has a low resistivity, and hence, can reduce the resistance of the gate electrode MG formed later. Further, the work function of the material for the portion (herein, the titanium nitride film) of the gate electrode MG formed later in contact with the gate insulation film can control the threshold voltage of the transistor including the gate electrode MG.

Figure 21:
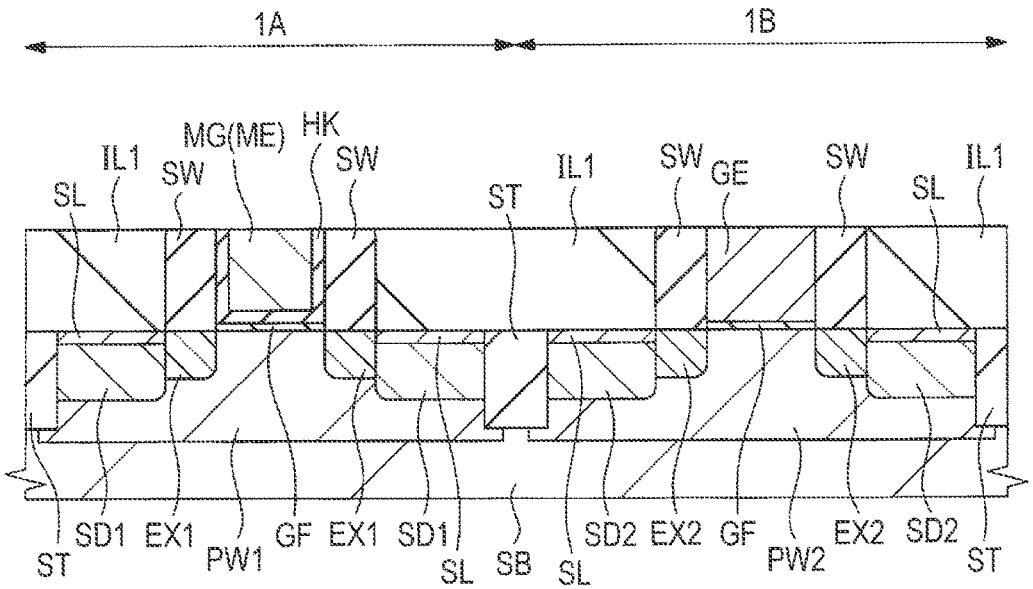
FIG. 21 is an essential part cross sectional view of the semiconductor device during a manufacturing step following FIG. 20.

Then, as shown in FIG. 21, the unnecessary portions of the metal film ME and the insulation film HK outside the trench TR are removed by a polishing treatment such as a CMP method. As a result, the insulation film HK and the metal film ME are embedded in the trench TR (Step S17 of FIG. 2).

Namely, in Step S17, the portions of the metal film ME and the insulation film HK outside the trench TR are removed, so that the insulation film HK and the metal film ME are left in the trench TR. This results in a state in which the insulation film HK and the metal film ME are left and embedded in the trench TR. Namely, the metal film ME is embedded in the trench TR via the insulation film HK.

In this manner, in the trench TR of the region from which the gate electrode DG has been removed, a gate electrode MG of the metal gate electrode is formed via the insulation film HK. The metal film ME embedded in the trench TR becomes the gate electrode MG of the MISFET in the MISFET formation region 1A. The insulation film HK embedded in the trench TR functions as the gate insulation film of the MISFET. In other words, the metal film ME is embedded in the trench TR via the insulation film HK, thereby to form the gate electrode MG.

Further, in the present embodiment, the gate electrode DG is removed, and is replaced with the gate electrode MG. The gate electrode MG is used as the gate electrode of the MISFET in the MISFET formation region 1A. For this reason, the gate electrode DG is a dummy gate electrode (pseudo gate electrode), and can be regarded as a replacement gate electrode or a substitute gate electrode. The gate electrode MG can be regarded as the gate electrode forming the MISFET.

Further, in the present embodiment, the gate electrode MG is formed using the metal film ME. For this reason, the gate electrode MG can be set as a metal gate electrode. By setting the gate electrode MG as a metal gate electrode, it is possible to obtain an advantage of allowing the suppression of the depletion phenomenon of the gate electrode MG, and the elimination of the parasitic capacitance. Further, it is also possible to obtain an advantage of enabling the size reduction of the transistor element (the reduction of the film thickness of the gate insulation film).

In the MISFET formation region 1A, the insulation film HK is formed at the bottom surface and the sidewall of the trench TR. The gate electrode MG is adjacent to the insulation film HK at the bottom surface and the sidewall (side surface) thereof. The insulation film GF and the insulation film HK are interposed between the gate electrode MG and the semiconductor substrate SB (p type well PW1). The insulation film HK is interposed between the gate electrode MG and the sidewall spacer SW. The insulation films GF and HK immediately under the gate electrode MG function as the gate insulation film of the MISFET. The insulation film HK is a high dielectric constant film, and hence functions as a high dielectric constant gate insulation film.

Further, in the polishing step of Step S17, the protective film HM can be also polished and removed. For this reason, when the polishing step of Step S17 is performed, respective top surfaces of the gate electrode MG and the gate electrode GE are exposed.

Further, also after etching and removing the gate electrode DG in Step S14, at the bottom of the trench TR, the insulation film GF remains in a layer form. For this reason, upon performing Steps S15, S16, and S17, and forming the gate electrode MG, the insulation film HK and the insulation film GF are interposed between the gate electrode MG and the semiconductor substrate SB. Namely, in the MISFET formation region 1A, the insulation film GF is interposed as an interface layer (at the interface) between the insulation film HK (the portion of the insulation film HK situated under the gate electrode MG) and the semiconductor substrate SB (p type well PW1). When the insulation film HK of a high dielectric constant film is not formed directly on the surface (silicon surface) of the semiconductor substrate SB, and an interface layer (herein, the insulation film GF) formed of a thin silicon oxide film or silicon oxynitride film is provided at the interface between the insulation film HK (the portion of the insulation film HK situated under the gate electrode MG) and the semiconductor substrate SB (p type well PW1), the number of defects such as trap levels can be reduced to improve the driving ability and the reliability.

Further, in the polishing step of Step S17, it is possible not only to remove the metal film ME and the insulation film HK outside the trench TR, but also to remove the protective film HM. Incidentally, when the protective film HM is formed of an insulator, after the polishing step of Step S17, the protective film HM may remain.

Figure 22:
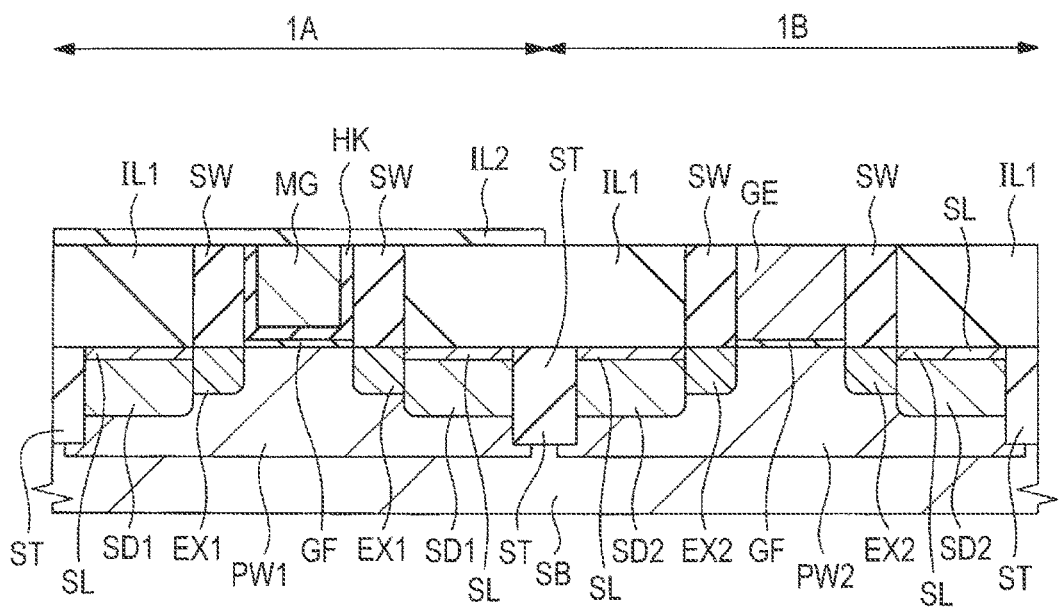
FIG. 22 is an essential part cross sectional view of the semiconductor device during a manufacturing step following FIG. 21.

Then, as shown in FIG. 22, such an insulation film (mask layer) IL2 as to cover the entire MISFET formation region 1A, and as to expose the gate electrode GE in the MISFET formation region 1B is formed over the insulation film IL1 (Step S18 of FIG. 2). The insulation film IL2 can be formed in the following manner. For example, over the semiconductor substrate SB, namely, over the insulation film IL1, the insulation film (insulation film IL2 forming insulation film) is formed in such a manner as to cover the entire MISFET formation regions 1A and 1B. Then, the insulation film is patterned using a photolithography technology and an etching technology. When the insulation film IL2 is formed, the top surface of the gate electrode GE is not covered with the insulation film IL2, and is exposed. The gate electrode MG is covered with the insulation film IL2, and is not exposed.

The insulation film IL2 is more preferably formed of a different insulation material from that for the insulation film IL1. This facilitates the formation of the insulation film IL2 having a desirable planar shape. For example, when the insulation film IL1 is formed of a silicon oxide film, the insulation film IL2 can be formed of a silicon nitride film.

Then, a metal silicide layer SL2 is formed at the top of the gate electrode GE (Step S19 of FIG. 2). The metal silicide layer SL2 can be formed by performing a so-called salicide process. Specifically, the metal silicide layer SL2 can be formed in the following manner.

Figure 23:
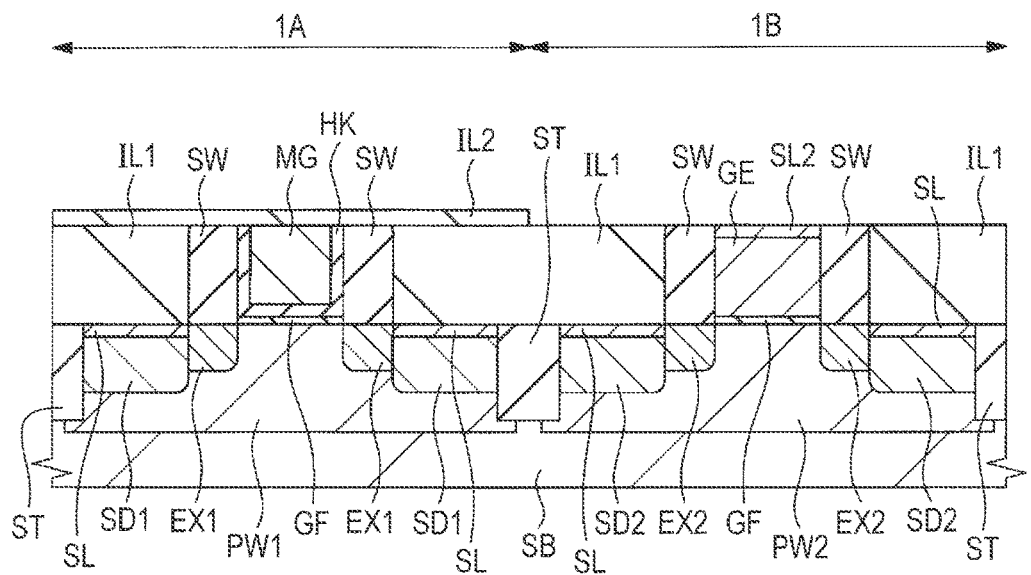
FIG. 23 is an essential part cross sectional view of the semiconductor device during a manufacturing step following FIG. 22.

Namely, first, over the insulation films IL1 and IL2 including over the top surface of the gate electrode GE, a metal silicide layer SL2 forming metal film (not shown) is formed (deposited). For the metal film, a simple-substance metal film (pure metal film) or an alloy film can be used. The metal film is formed of, for example, a cobalt (Co) film, a nickel (Ni) film, or a nickel platinum alloy film, and can be formed using a sputtering method, or the like. Then, the semiconductor substrate SB is subjected to a heat treatment (metal silicide layer SL2 forming heat treatment), thereby to allow the upper layer portion of the gate electrode GE to react with the metal silicide layer SL2 forming metal film. As a result, as shown in FIG. 23, a metal silicide layer SL2 is formed at the top of the gate electrode GE. Then, the unreacted portions of the metal film (metal silicide layer SL2 forming metal film) are removed by wet etching, or the like. FIG. 23 shows a cross sectional view at this stage. Further, after removing the unreacted portions of the metal film, a heat treatment can also be further performed.

The metal silicide layer SL2 is formed of, for example, a cobalt silicide layer, a nickel silicide layer, or, a nickel platinum silicide layer.

By performing a so-called salicide process in this manner, it is possible to form the metal silicide layer SL2 at the top of the gate electrode GE in a self-alignment manner, thereby to reduce the resistance of the gate electrode GE.

Further, with the gate electrode MG of a metal gate electrode covered with the insulation film IL2, the metal silicide layer SL2 is formed by a salicide process. This can surely prevent the gate electrode MG of a metal gate electrode from being affected by the salicide process.

Further, in the present embodiment, a description has been given to the case where the metal silicide layer SL2 is formed at the top of the gate electrode GE. As another aspect, the metal silicide layer SL2 may not be formed at the top of the gate electrode GE. When the metal silicide layer SL2 is not formed at the top of the gate electrode GE, it is essential only that Step S18 (insulation film IL2 formation step), and Step S19 (metal silicide layer SL2 formation step) are omitted.

Figure 24:
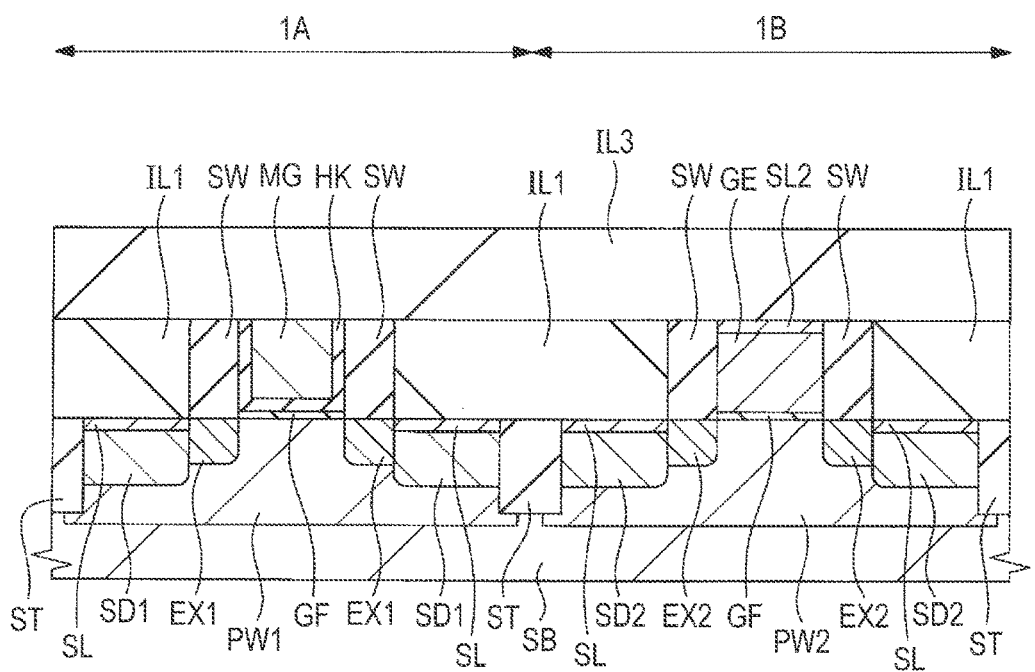
FIG. 24 is an essential part cross sectional view of the semiconductor device during a manufacturing step following FIG. 23.

Then, as shown in FIG. 24, entirely over the main surface of the semiconductor substrate SB, as an interlayer insulation film, an insulation film (interlayer insulation film) IL3 is formed (deposited). (Step S20 of FIG. 2).

Incidentally, FIG. 24 shows the case where the insulation film IL3 is formed after removing the insulation film IL2 by etching, or the like. In this case, the insulation film IL3 is formed over the insulation film IL1 in such a manner as to cover the gate electrode MG, the gate electrode GE, and the sidewall spacers SW. As another aspect, the insulation film IL3 can also be formed without removing the insulation film IL2.

As the insulation film IL3, for example, a silicon oxide type insulation film including mainly silicon oxide can be used. After the formation of the insulation film IL3, the top surface of the insulation film IL3 is polished by a CMP method, or is subjected to other processings. As a result, the flatness of the top surface of the insulation film IL3 can be enhanced.

Figure 25:
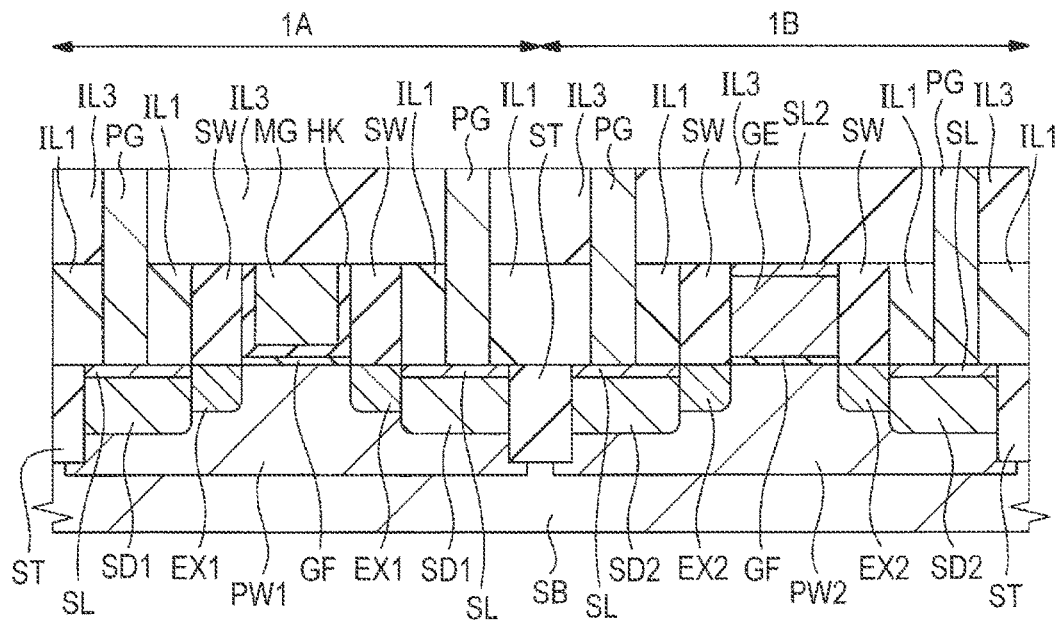
FIG. 25 is an essential part cross sectional view of the semiconductor device during a manufacturing step following FIG. 24.

Then, using a photoresist pattern (not shown) formed using a photolithography method over the insulation film IL3 as an etching mask, the insulation films IL3 and IL1 are dry etched. As a result, as shown in FIG. 25, contact holes (through holes) are formed in the insulation films IL3 and IL1 (Step S21 of FIG. 3). Then, a conductive plug PG formed of tungsten (W), titanium (Ti), titanium nitride (TiN), or the like is formed in each contact hole (Step S22 of FIG. 3). For example, a barrier conductor film is formed over the insulation film IL3 including over the bottom surface and the sidewall of the contact hole. Then, over the barrier conductor film, a main conductor film formed of a tungsten film, or the like is formed in such a manner as to fill the inside of the contact hole. The barrier conduct or film is formed of, for example, a titanium film or a titanium nitride film, or a lamination film thereof. Then, the unnecessary portions of the main conductor film and the barrier conductor film outside the contact hole CT are removed by a CMF method, an etch back method, or the like. As a result, the plug PG can be formed. The plugs PG are formed over the n+ type semiconductor regions SD1, the n+ type semiconductor regions SD2, the gate electrode MG, and the gate electrode GE, and the like, and are electrically coupled with them.

Figure 26:
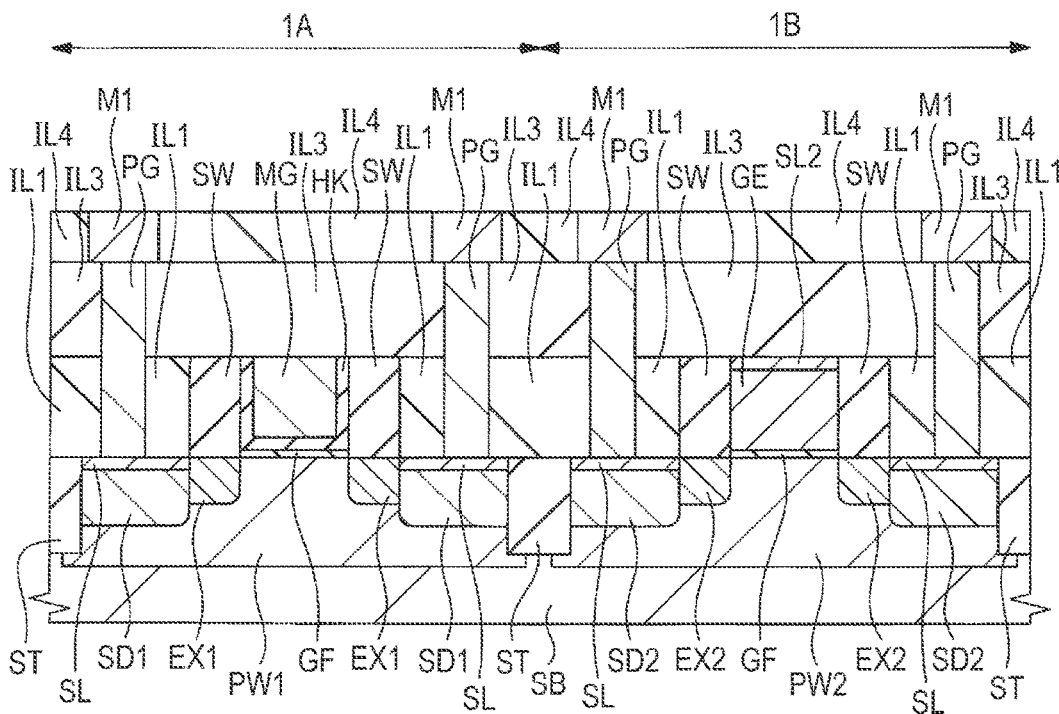
FIG. 26 is an essential part cross sectional view of the semiconductor device during a manufacturing step following FIG. 25.

Then, as shown in FIG. 26, over the insulation film IL3 including the plugs PG embedded therein, an insulation film IL4 is formed (Step S23 of FIG. 3). Then, a wiring trench is formed in a prescribed region of the insulation film IL4. Then, a wire M1 is embedded in the wiring trench using a single damascene technology (Step S24 of FIG. 3). The wire M1 is, for example, a copper wire including copper as a main component (embedded copper wire). The wire M1 is electrically coupled via the plug PG with the n+ type semiconductor regions SD1, the n+ type semiconductor regions SD2, the gate electrode MG, the gate electrode GE, and the like.

Then, by a dual damascene method, or the like, second-, or subsequent-layer wires are formed, but herein are not shown and are not described. Further, the wire M1, and upper-layer wires are not limited to damascene wires, and can also be formed by patterning a wiring conductor film, and can be formed as tungsten wires, aluminum wires, or the like.

In the manner up to this point, the semiconductor device of the present embodiment is manufactured.

Further, herein, a description has been given to the case where the MISFET formed in the MISFET formation region 1A is an n channel type MISFET. However, the conductivity type can be reversed, thereby to form a p channel type MISFET in the MISFET formation region 1A. Alternatively, both of an n channel type MISFET and a p channel type MISFET can also be formed in the MISFET formation region 1A. Further, herein, a description has been given to the case where the MISFET formed in the MISFET formation region 1B is an n channel type MISFET. However, the conductivity type can be reversed, thereby to form a p channel type MISFET in the MISFET formation region 1B. Alternatively, both of an n channel type MISFET and a p channel type MISFET can also be formed in the MISFET formation region 1B. Further, in the MISFET formation region 1B, the memory cell (single gate type or split gate type memory cell) of a nonvolatile memory can also be formed.

<Regarding Circumstances of Study>

The present inventors has conducted a study on the method for removing the dummy gate electrode by etching for the case where a MISFET is formed with a gate-last process. The step of removing the dummy gate electrode by etching corresponds to the etching step of the gate electrode DG of the Step S14 in the case of the present embodiment.

Herein, the gate-last process is a method for forming a MISFET in which source/drain regions are formed by ion implantation, or the like after forming a dummy gate electrode, and then, the dummy gate electrode is replaced with a gate electrode for MISFET. In the case of the present embodiment, in the MISFET formation region 1A, a MISFET is formed by the gate-last process, the gate electrode DG corresponds to the dummy gate electrode, and the gate electrode MG corresponds to the gate electrode for MISFET. On the other hand, a gate-first process is a method for forming a MISFET by forming source/drain regions by ion implantation, or the like after forming a gate electrode for MISFET. In the case of the present embodiment, in the MISFET formation region 1B, a MISFET is formed by the gate-first process, and the gate electrode GE corresponds to a gate electrode for MISFET.

Etching can be largely classified into two types of dry etching and wet etching.

The problem encountered when dry etching is applied to the step (corresponding to the Step S14) of removing the dummy gate electrode by etching is plasma damage on the gate insulation film (corresponding to the insulation film GF) of the base of the dummy gate electrode or the semiconductor substrate SB. With the dry etching process, the reaction species is often activated using the plasma generated by applying a high frequency wave in order to etch the etching target. The reaction species has a high energy, and hence, attacks and damages the base which should be left after the etching step when an etching reaction is effected. Further, the material exposed to the plasma is deteriorated in film quality. For this reason, application of dry etching to the step (corresponding to the Step S14) of removing the dummy gate electrode by etching leads to damaging of the materials (herein, the insulation film GF and the semiconductor substrate SB) in the periphery of the gate directly contributing to the device characteristics. This causes deterioration of the transistor characteristics and the reliability of the device.

Under such circumstances, in the present embodiment, not dry etching but wet etching is assumed to be adopted for the step (corresponding to the Step S14) of removing the dummy gate electrode by etching. Use of not dry etching but wet etching can etch and remove the dummy gate electrode without damaging the base (herein, the insulation film GF and the semiconductor substrate SB) of the dummy gate electrode.

The problems encountered when wet etching is adopted for the step (corresponding to the Step S14) of removing the dummy gate electrode by etching are the dummy gate removing ability, and the etching selectivity between the dummy gate electrode and the insulation film of the base thereof. As the obstacle against the removal of the dummy gate electrode, mention may be made of not the whole dummy gate electrode but the surface layer of the dummy gate electrode. The surface of the silicon film reacts with the oxygen in the air to form an oxide layer with ease. For this reason, the oxide layer resulting from the reaction with the oxygen in the air tends to be formed at the top surface of the dummy gate electrode (herein, the gate electrode DG) formed of silicon. Further, in the gate-last process, at the top surface of the dummy gate electrode (herein, the gate electrode DG), not only the simple silicon oxide layer but also the surface layer heterogeneous from the inside of the dummy gate electrode are formed.

The cause of the formation of the surface layer heterogeneous from the inside of the dummy gate electrode at the top surface of the dummy gate electrode (herein, the gate electrode DG) includes the polishing step (corresponding to the Step S12) for exposing the dummy gate electrode to be performed before the step (corresponding to the Step S14) of removing the dummy gate electrode by etching. The polishing step causes the formation of the surface layer heterogeneous from the inside of the dummy gate electrode at the top surface of the dummy gate electrode (herein, the gate electrode DG). For example, the deposition of the residue of the polishing slurry, or the like used in the polishing step causes the formation of the surface layer heterogeneous from the inside of the dummy gate electrode at the top surface of the dummy gate electrode (herein, gate electrode DG). Further, when the salicide process (corresponding to the Step S10) is carried out, accordingly, metal elements are diffused in the vicinity of the surface of the dummy gate electrode, or other phenomenon occurs. This may cause the formation of the surface layer heterogeneous from the inside of the dummy gate electrode at the top surface of the dummy gate electrode (herein, the gate electrode DG).

As an etchant for use in wet etching for removing the silicon film, one kind of chemical such as TMAH (Tetramethylammonium hydroxide) or aqueous ammonia is generally used. TMAH or aqueous ammonia has an ability of sufficiently dissolving the silicon film itself. However, when a surface layer heterogeneous from the inside of the dummy gate electrode is formed at the top surface of the dummy gate electrode formed of silicon, TMAH or aqueous ammonia is inferior in ability of removing the heterogeneous surface layer. As the chemical for removing the heterogeneous surface layer formed at the top surface of the dummy gate electrode formed of silicon, APM (Ammonia—Hydrogen Peroxide Mixtures) obtained by adding hydrogen peroxide water ($H_2O_2$) to aqueous ammonia is effective. However, when the dummy gate electrode formed of silicon is tried to be etched by APM, under the influence of $H_2O_2$, the etching rate of Si is reduced. Accordingly, the dummy gate electrode removing ability is reduced. Incidentally, APM is a mixed solution of ammonia, hydrogen peroxide, and water.

In addition, as the chemical for removing the surface oxide layer, HF (Hydrofluoric acid) may be mentioned as a candidate. However, hydrofluoric acid (HF) is a chemical which also removes the oxide film of the base of the dummy gate electrode, and further, does not have a Si removing ability. For this reason, hydrofluoric acid cannot be applied as an etchant for removing the dummy gate electrode.

Therefore, with wet etching using one kind of etchant, it is not easy to precisely remove the surface layer of the dummy gate electrode, and the dummy gate electrode itself formed of silicon while suppressing etching on the base of the dummy gate electrode.

When, in the step of removing the dummy gate electrode by etching, the dummy gate electrode cannot be removed well, so that etching residue of the dummy gate electrode is generated, the reliability of the manufactured semiconductor device is reduced. Alternatively the manufacturing yield of the semiconductor device is reduced. For this reason, in the step of removing the dummy gate electrode by etching, desirably, stable wet etching is allowed to be performed, thereby to prevent the generation of the etching residue of the dummy gate electrode.

Under such circumstances, the present inventors conducted selection of the etching chemical, and construction of the treatment sequence in view of the removal of the surface layer of the dummy gate electrode, the removal of the dummy gate electrode itself formed of silicon, the suppression of etching on the base of the dummy gate electrode, and the like for the step (corresponding to the Step S14) of removing the dummy gate electrode by etching. This will be described below.

<Regarding Etching Step of Step S14>

Figure 27:
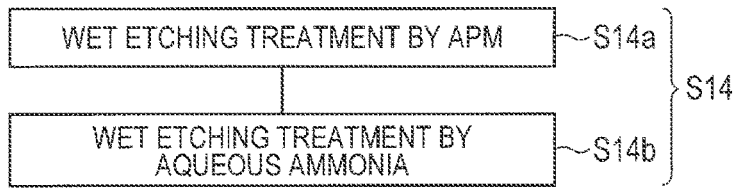
FIG. 27 is a process flowchart showing the details of the etching step of Step 314.

FIG. 27 is a process flowchart showing the details of the etching step of the Step S14.

In the present embodiment, in the Step S14, the gate electrode DG of the dummy gate electrode was removed by wet etching. The etching of the Step S14 is performed by the wet etching treatment by APM (APM solution) (Step S14a of FIG. 27), and the wet etching treatment by aqueous ammonia (Step S14b of FIG. 27). In Step S14, first, the wet etching treatment by APM (Step S14a) is performed. Thereafter, the wet etching treatment by aqueous ammonia (Step S14b) is performed.

In Step S14, first, in Step S14a, the wet etching treatment by APM is performed, so that the surface (top surface) of the gate electrode DG is wet etched by APM. Even when a surface layer heterogeneous from the inside of the gate electrode DG is formed at the top surface of the gate electrode DG before performing Step S14 (e.g., in the polishing step of Step S12), the surface layer can be etched and removed by the wet etching treatment by APM of Step S14a.

Then, after the wet etching treatment by APM of Step S14a, the wet etching treatment by aqueous ammonia of Step S14b is performed. As a result, the gate electrode DG formed of silicon can be etched and removed. The wet etching treatment by aqueous ammonia of Step S14b is performed until the whole gate electrode DG is removed. The heterogeneous surface layer formed at the top surface of the gate electrode DG before performing Step S14 (e.g., in the polishing step of Step S12) has already been removed by the the wet etching treatment by APM of Step S14a. For this reason, with the wet etching treatment by aqueous ammonia of Step S14b, the heterogeneous surface layer is not required to be etched, and it is essential only that the gate electrode DG formed of silicon is removed.

Incidentally, the wet etching treatment by APM of Step S14a can be regarded as a step of wet etching the surface (top surface) of the gate electrode DG by APM, and the wet etching treatment by aqueous ammonia of Step S14b can also be regarded as a step of removing the gate electrode DG by wet etching using aqueous ammonia.

When aqueous ammonia is used as an etchant, the etching selectivity of Si can be enhanced, so that only Si can be selectively etched. Whereas, when APM is used as an etchant, the etching selectivity of Si is not so high. For this reason, for removal of Si, aqueous ammonia is suitable. However, for removal of the heterogeneous surface layer formed at the top surface of the gate electrode DG, aqueous ammonia is not suitable. Instead, APM is more suitable. Under such circumstances, in the present embodiment, in Step S14, first, in Step S14a, the surface of the gate electrode DG is wet etched by APM. Thereafter, in Step S14b, the gate electrode DG is removed by wet etching using aqueous ammonia.

A description will be given to one example of the etching conditions for the wet etching treatment by APM of Step S14a and the wet etching treatment by aqueous ammonia of Step S14b. In the wet etching treatment by APM of Step S14a, the density ratio (volume mixing ratio) of the etchants can be set at, for example, $NH_4OH:H_2O_2:H_2O$=about 4:5:200, the temperature of the etchant can be wet at, far example, about 45° C., and the etching time can be set at, for example, about 300 seconds. In the wet etching treatment by aqueous ammonia of Step S14b, the concentration ratio (volume mixing ratio) of the etchants can be set at, for example, $NH_4OH:H_2$=about 1:50, the temperature of the etchant can be set at, for example, about 50° C., and the etching time can be set at, for example, about 1800 seconds although depending upon the thickness of the gate electrode DG. When the etching conditions are used, the etching amount (etching thickness) of the insulation film GF of the base after removing the gate electrode DG can be set at, for example, about 1 nm. Further, the formed film thickness of the insulation film GF in Step S4 can be set at, for example, 2 to 3 nm. Namely, the etching amount (etching thickness) of the insulation film GF in Step S14 is smaller than the formed film thickness of the insulation film GF in Step S4. For this reason, also after removing the gate electrode DG in Step S14, the insulation film GF can be left in a layer form at the bottom of the trench TR. This can prevent the semiconductor substrate SB from being etched at the bottom of the trench TR in Step S14.

The wet etching treatment by APM is effective for etching the layer (herein, the heterogeneous surface layer at the top surface of the gate electrode DG) difficult to remove with the wet etching treatment by aqueous ammonia. Namely, the heterogeneous surface layer formed at the top surface of the gate electrode DG before performing Step S14 (e.g., in the polishing step of Step S12) is less likely to be removed by aqueous ammonia, but tends to be removed by APM.

Distinct from the present embodiment, the case where in Step S14, the wet etching treatment by APM is not performed, but only the wet etching treatment by aqueous ammonia is performed is assumed. This case will be referred to as a first study example. In the case of the first study example, the heterogeneous surface layer formed at the top surface of the gate electrode DG before performing Step S14 (e.g., in the polishing step of Step S12) is difficult to remove only by the wet etching treatment by aqueous ammonia. For this reason, there is a risk that, at the stage upon completion of wet etching, the etching residue of the gate electrode DG may be generated.

Whereas, distinct from the present embodiment, the case where in Step S14, the wet etching treatment by aqueous ammonia is not performed, and only the wet etching treatment by APM is performed is assumed. This case will be referred to as a second study example. In the case of the second study example, the heterogeneous surface layer formed at the top surface of the gate electrode DG before performing Step S14 (e.g., in the polishing step of Step S12) can be removed by the wet etching treatment by APM. However, with the wet etching treatment by APM, under the influence of $H_2O_2$ (hydrogen peroxide) contained in APM, the etching rate of the gate electrode DG formed of silicon is reduced. Accordingly, the etching time increases, so that the throughput of semiconductor devices is reduced. For example, although depending upon the concentration of the etchant, the etching rate of a silicon film by APM is equal to, or less than one tenth the etching rate of a silicon film by aqueous ammonia. Further, APM is lower in etching selectivity of silicon relative to a silicon oxide film than aqueous ammonia. For this reason, in the case of the second study example, the etching amount of the insulation film GF of the base of the gate electrode DG increases, so that there is a risk that the semiconductor substrate SB may be exposed at the bottom of the trench TR. Further, in the case of the second study example, the interlayer insulation film (corresponding to the insulation film IL1) is also etched to a certain degree. A large etching amount of the interlayer insulation film increases the risk of the generation of the polishing residue in the polishing step of the Step S17, and hence is not desirable.

In contrast, in the present embodiment, first, the wet etching treatment by APM is performed. Then, the wet etching treatment by aqueous ammonia is performed. Namely, first, the surface of the gate electrode DG is wet etched by APM. As a result, the heterogeneous surface layer formed at the top surface of the gate electrode DG can be removed. Then, by wet etching using aqueous ammonia, the gate electrode DG formed of silicon can be removed. The heterogeneous surface layer formed at the top surface of the gate electrode DG before performing Step S14 can be removed by the wet etching treatment by APM. For this reason, with the wet etching treatment by aqueous ammonia to be performed subsequently, the heterogeneous surface layer is not required to be etched, and it is essential only that the gate electrode DG formed of silicon is removed. Accordingly, it is possible to prevent the generation of etching residue of the gate electrode DG.

For this reason, in the case of the present embodiment, the gate electrode DG removing ability can be improved in Step S14 as compared with the case of the first study example. This can reduce the risk of the generation of the etching residue of the gate electrode DG. For this reason, it is possible to improve the reliability of the manufactured semiconductor device. Further, it is possible to improve the manufacturing yield of the semiconductor devices.

Further, in the case of the present embodiment, the etching time in Step S14 can be shortened as compared with the case of the second study example. Further, in the case of the present embodiment, the wet etching treatment by aqueous ammonia removes the gate electrode DG, so that the insulation film GF is exposed. For this reason, in the case of the second study example, the insulation film GF is overetched by APM. However, in the case of the present embodiment, the insulation film GF is overetched by aqueous ammonia. Accordingly, in the case of the present embodiment, the etching amount (etching thickness) of the insulation film GF of the base of the gate electrode DG can be reduced as compared with the case of the second study example. This can reduce the risk that the semiconductor substrate SB may be exposed at the bottom of the trench TR at the stage upon completion of Step S14. For this reason, it is possible to improve the reliability of the manufactured semiconductor device. Further, it is possible to improve the manufacturing yield of the semiconductor device.

Further, in the case of the present embodiment, aqueous ammonia is used for mostly removing the gate electrode DG. For this reason, as compared with the case of the second study example, the time of the wet etching treatment by APM can be shortened. Accordingly, the etching amount (etching thickness) of the interlayer insulation film (corresponding to the insulation film IL1) in Step S14 can also be suppressed.

Further, the etching amount (etching thickness) of the gate electrode DG in Step S14a is preferably smaller than the etching amount (etching thickness) of the gate electrode DG in Step S14b. This can more precisely shorten the etching time in Step S14.

<Regarding Specific Step Sequence of Step S14>

Figure 28:
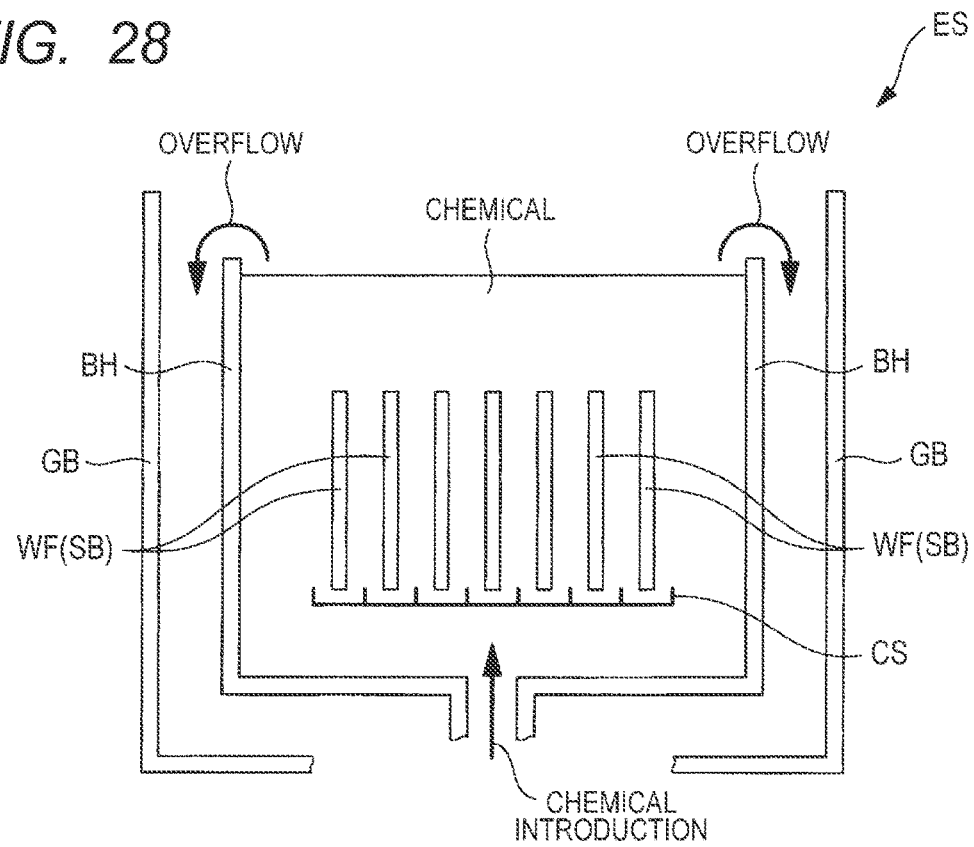
FIG. 28 is an explanatory view schematically showing the treatment device for use in Step S14.

FIG. 28 is an explanatory view (cross sectional view) schematically showing a treatment device (etching device) for use in Step S14. Incidentally, in FIG. 28, hatching is omitted for ease of understanding of the drawing.

The treatment device ES for use in Step S14 is a batch type treatment device, and has a treatment tank (chemical tank) BH. In the treatment tank BH, a chemical is allowed to be introduced (supplied) from the bottom of the treatment tank BH into the treatment tank BH. Further, the chemical introduced from the bottom of the treatment tank BH is stored in the treatment tank BH. However, the chemical overflowed from the top of the treatment tank BH is to be collected in an external tank (collection tank) GB. Further, in the treatment tank BH, a trench CS capable of mounting and holding a wafer thereon having a cassette role is arranged. In the trench CS of the wafer holding part, a plurality of wafers (semiconductor wafers) WF can be arranged (accommodated). Incidentally, the treatment device ES (the treatment tank BH and the external tank GB) is arranged in a treatment chamber connected with exhaust piping, although not shown.

Then, the step sequence of the etching step of Step S14 will be described in brief as follows.

Namely, in the present embodiment, using a one-bath type treatment device ES, in one treatment tank BH, a wafer WF is subjected to a treatment by APM (corresponding to Step S14a), a treatment by aqueous ammonia (corresponding to Step S14b), and a water washing treatment by pure water (rinsing treatment), successively. First, the wafer WF is immersed (soaked) in the chemical (herein, APM) stored in the treatment tank BH, and this is held for a prescribed time, thereby to perform an APM treatment (corresponding to Step S14a) on the wafer WF. Then, with the wafer WF immersed in the chemical in the treatment tank BH, while introducing (supplying) aqueous ammonia from the bottom of the treatment tank BH into the treatment tank BH, the chemical is caused to overflow from the top of the treatment tank BH. As a result, for the chemical in the treatment tank BH, APM is gradually replaced with aqueous ammonia. Then, also after replacing the chemical in the treatment tank BH with aqueous ammonia, the wafer WF is kept being immersed in the chemical for a prescribed time. Thus, the aqueous ammonia treatment (corresponding to Step S14b) on the wafer WF is performed. During this period, the wafer WF is immersed in the chemical stored in the treatment tank BH. Then, in the treatment tank BH, the water washing treatment (rinsing treatment) on the wafer WF is performed.

Below, the step sequence of the etching step of Step S14 will be described more specifically.

First, with the wafer WF not arranged in the trench CS of the wafer holding part in the treatment tank BH, APM (APM chemical) is introduced from the bottom of the treatment tank BH into the treatment tank BH, and is stored therein. At this step, for example, about 45° C. warm water (heated pure water), $NH_4OH$ (ammonia), and $H_2O_2$ (hydrogen peroxide) are introduced at flow rates of 25 L/min, 500 ml/min, and 625 ml/min, respectively for about 300 seconds into the treatment tank BH. As a result, a chemical including APM with a concentration ratio of $NH_4OH:H_2O_2:H_2O$=about 4:5:200 is stored in the treatment tank BH. Use of warm water results in the temperature of the chemical of about 45° C. Incidentally, the flow rates and the time herein mentioned are assumed for the case where the volume of the treatment tank BH is, for example, about 40 L (liters). The chemical (herein, APM) overflowed from the top of the treatment tank BH is collected in the external tank GB, but is not reused. Incidentally, warm water, $NH_4OH$ (ammonia), and $H_2O_2$ (hydrogen peroxide) may be introduced in a mixed state into the treatment tank BH, or may be introduced in an unmixed state into the treatment tank BH. In either case, APM is introduced and stored in the treatment tank BH.

Then, the introduction of the chemical (herein, APM) from the bottom of the treatment tank BH into the treatment tank BH is stopped, and it is checked that the temperature of the chemical (APM) stored in the treatment tank BH has been stabilized. Then, a plurality of wafers WF are immersed in the chemical in the treatment tank BH, and are arranged (accommodated) in the trench CS of the wafer holding part. Incidentally, the wafer WF herein used corresponds to the semiconductor substrate SB. Namely, the semiconductor substrate SB subjected to the steps up to just before performing Step S14 is immersed as the wafer WF in the chemical in the treatment tank BH, and is arranged (accommodated) in the trench CS of the wafer holding part. The plurality of wafers WF arranged in the trench CS of the wafer holding part are kept being immersed in the chemical (herein, APM) stored in the treatment tank BH. A wet treatment with the chemical (APM treatment) is performed on respective wafers WF. This corresponds to the the wet etching treatment by APM of Step S14a. The APM treatment is kept for a prescribed time, for example, about 1800 seconds.

The wafer WF is kept being immersed in the chemical including APM for a prescribed time (e.g., about 1800 seconds). Then, aqueous ammonia is introduced from the bottom of the treatment tank BH into the treatment tank BH, thereby to expel APM from the treatment tank BH. Thus, for the chemical stored in the treatment tank BH, APM is replaced with aqueous ammonia. For example, about 50° C. warm water and ammonia ($NH_4OH$ concentration of 30%) are introduced at flow rates of 25 L/min and 500 ml/min, respectively, for about 600 seconds into the treatment tank BH. As a result, aqueous ammonia with a concentration ratio of $NH_4OH:H_2O$=about 1:50 is introduced and stored in the treatment tank BH. During the period during which aqueous ammonia is introduced from the bottom of the treatment tank BH into the treatment tank BH, the chemical stored in the treatment tank BH overflows from the top of the treatment tank BH. Accordingly, for the chemical in the treatment tank BH, APM is gradually replaced with aqueous ammonia. The chemical overflowed from the top of the treatment tank BH is collected in the external tank GB, but is not reused. Incidentally, during the period during which aqueous ammonia is introduced into the treatment tank BH, the plurality of wafers WF arranged in the trench CS of the wafer holding part are kept being immersed in the chemical stored in the treatment tank BH. Further, warm water and $NH_4OH$ (ammonia) may be introduced in a mixed state into the treatment tank BH, or may be introduced in an unmixed state into the treatment tank BH. In either case, aqueous ammonia is introduced and stored in the treatment tank BH.

While causing the chemical to overflow from the top of the treatment tank BH, a sufficient amount of aqueous ammonia is introduced from the bottom of the treatment tank BH into the treatment tank BH. As a result, as the chemical stored in the treatment tank BH, APM can be replaced with aqueous ammonia. Although depending upon the volume of the treatment tank BH, aqueous ammonia is introduced from the bottom of the treatment tank BH into the treatment tank BH, for example, at the flow rates and the time. As a result, as the chemical stored in the treatment tank BH, APM can be replaced with aqueous ammonia with precision.

From the bottom of the treatment tank BH into the treatment tank BH, aqueous ammonia is introduced for a prescribed time (e.g., about 600 seconds at the flow rate). Thus, as the chemical stored in the treatment tank BH, APM is replaced with aqueous ammonia. Then, the introduction of aqueous ammonia from the bottom of the treatment tank BH into the treatment tank BH is stopped. Thereafter, without supply of the chemical from the bottom of the treatment tank BH into the treatment tank BH, the plurality of wafers WF arranged in the trench CS of the wafer holding part are kept being immersed in the chemical (herein, aqueous ammonia) stored in the treatment tank BH for a prescribed time (e.g., about 1200 seconds).

During the period during which aqueous ammonia is introduced from the bottom of the treatment tank BH into the treatment tank BH (about 600 seconds), and during the period during which the wafers WF are kept being immersed in the chemical including aqueous ammonia after subsequently stopping the introduction of aqueous ammonia into the treatment tank BH (about 1200 seconds), each wafer WF is subjected to a wet treatment (aqueous ammonia treatment) by the chemical (herein, aqueous ammonia) in the treatment tank BH. This corresponds to the wet etching treatment by aqueous ammonia of the Step S14b. The aqueous ammonia treatment is performed for a total of about 1800 seconds.

The wafers WF are kept being immersed in the chemical including aqueous ammonia for a prescribed time. Then, the process goes to the water washing treatment (rinsing treatment). The washing treatment can be specifically performed in the following manner.

First, from the bottom of the treatment tank BH into the treatment tank BH, room-temperature (about 23° C.) pure water is introduced at a prescribed flow rate (e.g., 25 L/min) for a prescribed time (e.g., about 60 seconds). During the period during which pure water is introduced from the bottom of the treatment tank BH into the treatment tank BH, the chemical stored in the treatment tank BH overflows from the top of the treatment tank BH. Accordingly, the chemical in the treatment tank BH approaches pure water from aqueous ammonia. Thus, the ammonia concentration of the chemical decreases. The chemical overflowed from the top of the treatment tank BH is collected in the external tank GB, but is not reused. Then, the introduction of pure water from the bottom of the treatment tank BH into the treatment tank BH is stopped. While washing (water washing) the wafers WF by pure water jetted through the shower nozzle (not shown) arranged over the treatment tank BH, the inside of the treatment tank BH is subjected to quick dump. Thus, the chemical in the treatment tank BH is discharged (quickly discharged) from the bottom of the treatment tank BH to the outside of the treatment tank BH. This resolves the state in which the wafers WF are immersed in the chemical in the treatment tank BH. Thus, the chemical is removed from the surfaces of the wafers WF. After discharging the chemical in the treatment tank BH to the outside of the treatment tank BH, pure water is introduced from the bottom of the treatment tank BH into the treatment tank BH at a prescribed flow rate (e.g., 25 L/min) for a prescribed time (e.g., about 600 seconds), and is stored therein. The pure water overflowed from the top of the treatment tank BH is collected in the external tank GB. As a result, pure water is stored in the treatment tank BH, and the plurality of wafers WF arranged in the trench CS of the wafer holding part are immersed in the pure water stored in the treatment tank BH. As a result, the plurality of wafers WF arranged in the trench CS of the wafer holding part are washed (water washed) sufficiently by pure water. In this manner, the water washing treatment is performed. When quick dump is used in the water washing treatment as described above, the time required for the water washing treatment can be shortened. In addition, excessive etching is suppressed or prevented from being caused by the remaining ammonia component after the process transfers to the water washing treatment.

Then, the plurality of wafers WF arranged in the trench CS of the wafer holding part are taken out, and moved to the outside of the treatment tank BH. Thus, the drying treatment of the wafers WF is performed. The drying treatment can be performed by, for example, drying the wafers WF using ISA (isopropyl alcohol) in a dry tank (not shown). As a result, Step S14 is completed. The wafers WF are transported to the manufacturing device for performing the next step.

Then, in the treatment device ES, as described above, APM is introduced from the bottom of the treatment tank BH into the treatment tank BH, and is stored therein. Then, a plurality of wafers of the subsequent lot are immersed in the chemical in the treatment tank BH, and are arranged in the trench CS of the wafer holding part. Thus, the wafers are subjected to an APM treatment (corresponding to the Step S14a), but a repeated description thereon is omitted.

Thus, in the present embodiment, Step S14a is performed by immersing the wafers WF (semiconductor substrates SB) in the chemical including APM in the treatment tank BH. Step S14b is performed by replacing APM with aqueous ammonia as the chemical in which the wafers WF (semiconductor substrates SB) have been immersed. As described above, between Step S14a (APM treatment) and Step S14b (aqueous ammonia treatment), the step of subjecting the wafers WF (semiconductor substrates SB) to a water washing treatment is not performed. After Step S14b (aqueous ammonia treatment), the step of subjecting the wafers WF (semiconductor substrates SB) to the water washing treatment in the treatment tank BH is performed. Then, subsequent steps (Steps S15, S16, and S17) are performed.

In the present embodiment, for etching of Step S14, using the batch type treatment device ES, there is used a one-bath treatment method in which a chemical is compounded for each chemical treatment lot, and the chemical after the treatment is drained. Both of the APM treatment (corresponding to Step S14a) and the aqueous ammonia treatment (corresponding to Step S14b) are the treatments using an alkaline chemical containing ammonia. For this reason, the APM treatment (corresponding to Step S14a) and the aqueous ammonia treatment (corresponding to Step S14b) can be carried out in one treatment tank BH. The APM treatment (corresponding to Step S14a) and the aqueous ammonia treatment (corresponding to Step S14b) are performed in one treatment tank BH. For this reason, for switching the chemical from APM to aqueous ammonia, a transport sequence is not required. With the wafers WF immersed in the chemical, the chemical can be switched from APM to aqueous ammonia.

Distinct from the present embodiment, when the treatment tank for performing the APM treatment (corresponding to Step S14a) therein, and the treatment tank for performing the aqueous ammonia treatment (corresponding to Step S14b) therein are provided separately, after performing the APM treatment (corresponding to Step S14a) in the treatment tank for the APM treatment, the wafers are required to be transported from the treatment tank for the APM treatment to the treatment tank for the aqueous ammonia treatment. In this case, during the transportation thereof, moisture is removed from the wafer surfaces, so that the wafers are exposed to air. As a result, an oxide film may be formed at the surface of the gate electrode DG. However, when an oxide film is formed at the surface of the gate electrode DG during transportation, the oxide film is less likely to be removed by the aqueous ammonia treatment (corresponding to Step S14b). This may cause etching residue of the gate electrode DG. Further, drying of the surface of each wafer during the transportation causes a watermark. This entails a concern about the generation of a defect caused by the watermark.

In contrast, in the present embodiment, the APM treatment (corresponding to Step S14a) and the aqueous ammonia treatment (corresponding to Step S14b) are performed in one treatment tank BH. For this reason, with the wafers WF immersed in the chemical, the chemical can be switched from APM to aqueous ammonia. Accordingly, the APM treatment (Step S14a) and the aqueous ammonia treatment (Step S14b) can be continuously performed without exposing the wafers WF to the air. Further, between the APM treatment (Step S14a) and the aqueous ammonia treatment (Step S14b), the water washing treatment (rinsing treatment) is not performed. For this reason, after removing the heterogeneous surface layer at the top surface of the gate electrode DG by the APM treatment (Step S14a), the wafers WF are not exposed to the air. Accordingly, without the formation of an oxide film at the top surface of the gate electrode DG, the aqueous ammonia treatment (Step S14b) can be performed. As a result, the gate electrode DG can be removed precisely. This can more precisely prevent the generation of the etching residue of the gate electrode DG after the completion of Step S14. Further, a risk of the formation of a watermark after the APM treatment (Step S14a) and before performing the aqueous ammonia treatment (Step S14b) can be avoided. This can prevent the generation of a defect caused by the watermark.

Further, in the present embodiment, the chemical used in the APM treatment (Step S14a), and the chemical used in the aqueous ammonia treatment (Step S14b) are not reused, and thrown away. For this reason, using a chemical freshly compounded for each lot, the APM treatment (Step S14a) or the aqueous ammonia treatment (Step S14b) is performed. If the chemical is reused, the metal component accumulated in the chemical, and the component mixed in the chemical due to etching of the Si film (gate electrode DG) may be deposited again as a foreign matter at the wafer. However, in the present embodiment, such a concern can be avoided. In the present embodiment, there is used the batch type treatment device with which the chemical overflowed from the treatment tank is not reused, and thrown away. As a result, it is possible to obtain a more excellent etching removing performance as compared with the case using the batch treatment device with which the chemical overflowed from the treatment tank is circulated in the treatment tank, and is reused.

Second Embodiment

Figure 29:
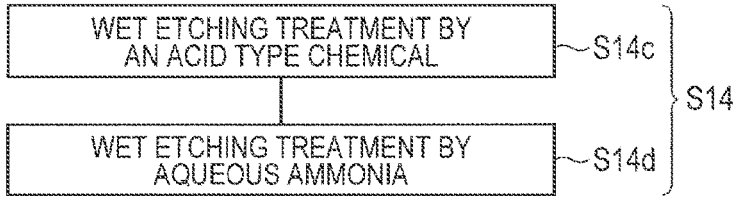
FIG. 29 is a process flowchart showing the details of the etching step of Step S14 in another embodiment.

FIG. 29 is a process flowchart showing the details of the etching step of Step S14 in the present Second Embodiment, and corresponds to the FIG. 27 of the First Embodiment.

In the present Second Embodiment, the difference from the First Embodiment will be mainly described, and the same points as those in the First Embodiment will not be described. The First Embodiment and the present Second Embodiment are different in the Step S14 from each other. However, the present Second Embodiment is also the same in other steps than Step S14 as the First Embodiment.

As indicated from reference to FIGS. 27 and 29, in the present Second Embodiment, in Step S14, a wet etching treatment by the acid type chemical (acid-containing chemical, or acidic chemical) of Step S14c is performed in place of the wet etching treatment by APM of Step S14a of the First Embodiment. This point is the major difference between the First Embodiment and the present Second Embodiment. In the case of the First Embodiment, after Step S14a, and in the case of the present Second Embodiment, after Step S14c, the wet etching treatment by aqueous ammonia (Step S14b or Step S14d) is performed. This is common to both the cases. Below, a description will be given specifically.

In Step S14, the gate electrode DG of a dummy gate electrode is removed by wet etching. In the First Embodiment, the etching of the Step S14 is performed by the wet etching treatment by APM (Step S14a of FIG. 27), and the wet etching treatment by aqueous ammonia (Step S14b of FIG. 27). In contrast, in the present Second Embodiment, the etching of the Step S14 is performed by the wet etching treatment by an acidic chemical (Step S14c of FIG. 29), and the wet etching treatment by aqueous ammonia (Step S14d of FIG. 29). Namely, in the present Second Embodiment, in Step S14, first, the wet etching treatment by an acidic chemical (Step S14c) is performed. Then, the wet etching treatment by aqueous ammonia (Step S14d) is performed.

In the present Second Embodiment, in Step S14, first, in Step S14c, the wet etching treatment by an acidic chemical is performed. As a result, the surface (top surface) of the gate electrode DG is wet etched by the acidic chemical. Even when a surface layer heterogeneous from the inside of the gate electrode DG is formed at the top surface of the gate electrode DG before performing Step S14 (e.g., in the polishing step of Step S12), the surface layer can be etched and removed by the wet etching treatment by an acidic chemical of Step S14c.

Then, after the wet etching treatment by an acidic chemical of Step S14c, the wet etching treatment by aqueous ammonia of Step S14d is performed. As a result, the gate electrode DG formed of silicon can be etched and removed. The wet etching treatment by aqueous ammonia of Step S14d is performed until the whole gate electrode DG is removed. The heterogeneous surface layer formed at the top surface of the gate electrode DG before performing Step S14 (e.g., in the polishing step of Step S12) has already been removed by the wet etching treatment by an acidic chemical of Step S14c. For this reason, with the etching treatment by aqueous ammonia of Step S14d, the heterogeneous surface layer is not required to be etched. It is essential only that the gate electrode DG formed of silicon is removed.

Incidentally, the wet etching treatment by an acidic chemical of Step S14c can be regarded as the step of wet etching the surface (top surface) of the gate electrode DG by an acidic chemical. The wet etching treatment by aqueous ammonia of Step S14d can be regarded as the step of removing the gate electrode DG by wet etching using aqueous ammonia.

When aqueous ammonia is used as an etchant, the etching selectivity of Si can be enhanced. Accordingly, only Si can be selectively etched. For this reason, aqueous ammonia is suitable for removal of Si. However, aqueous ammonia is not suitable for removal of the heterogeneous surface layer formed at the top surface of the gate electrode DG. An acidic chemical is more suitable than that. Under such circumstances, in the present Second Embodiment, in Step S14, first, in Step S14c, the surface of the gate electrode DG is wet etched by an acidic chemical. Then, in Step S14d, the gate electrode DG is removed by wet etching using aqueous ammonia.

In the present Second Embodiment, in Step S14, first, the surface of the gate electrode DG is wet etched by an acidic chemical. As a result, the heterogeneous surface layer formed at the top surface of the gate electrode DG can be removed. Then, by wet etching using aqueous ammonia, the gate electrode DG formed of silicon can be removed. The heterogeneous surface layer formed at the top surface of the gate electrode DG before performing Step S14 can be removed by the wet etching treatment by an acidic chemical. For this reason, with the wet etching treatment by aqueous ammonia to be performed subsequently, the heterogeneous surface layer is not required to be etched. It is essential only that the gate electrode DG formed of silicon is removed. This can prevent the generation of the etching residue of the gate electrode DG.

For this reason, in the case of the present Second Embodiment, as compared with the case where the gate electrode DG has been removed by performing only the wet etching using aqueous ammonia of Step S14d without performing Step S14c as distinct from the present Second Embodiment, the gate electrode DG removing ability in Step S14 can be improved, and the risk of causing the etching residue of the gate electrode DG can be reduced. Therefore, the reliability of the manufactured semiconductor device can be improved. Further, the manufacturing yield of semiconductor devices can be improved.

Further, in the present Second Embodiment, after Step S14c, the gate electrode DG is removed by wet etching using aqueous ammonia in Step S14d. This can shorten the etching time in Step S14. Further, as with the First Embodiment, also in the present Second Embodiment, with the wet etching treatment by aqueous ammonia, the gate electrode DG is removed, and the insulation film GF is exposed. Accordingly, the insulation film GF is overetched by aqueous ammonia. For this reason, as with the First Embodiment, also in the present Second Embodiment, the etching amount (etching thickness) of the insulation film GF of the base of the gate electrode DG can be reduced. This can reduce the risk that at the stage upon completion of Step S14, the semiconductor substrate SB may be exposed at the bottom of the trench TR. Therefore, the reliability of the manufactured semiconductor device can be improved. Further, the manufacturing yield of semiconductor devices can be improved.

Further, in the present Second Embodiment, for mostly removing the gate electrode DG, aqueous ammonia is used. For this reason, the time of the wet etching treatment using an acidic chemical (Step S14c) can be shortened. This can also suppress the etching amount (etching thickness) of the interlayer insulation film (corresponding to the insulation film IL1) in the Step S14.

Further, the etching amount (etching thickness) of the gate electrode DG in Step S14c is preferably smaller than the etching amount (etching thickness) of the gate electrode DG in Step S14d. This can more surely shorten the etching time in Step S14.

The heterogeneous surface layer formed at the top surface of the gate electrode DG before performing Step S14 was removed by APM in Step S14a in the case of the First Embodiment, but is removed by an acidic chemical in Step S14c in the case of the present Second Embodiment. For this reason, when the heterogeneous surface layer formed at the top surface of the gate electrode DG before performing Step S14 has a nature of being less likely to be removed by APM, and tending to be removed by an acidic chemical, by applying the present Second Embodiment thereto, it is possible to more enhance the effect of preventing the generation of the etching residue of the gate electrode DG.

Further, in the First Embodiment, APM of an alkaline chemical is used in Step S14a, and aqueous ammonia of an alkaline chemical is used in Step S14b. For this reason, the treatment tank for use in Step S14a, and the treatment tank for use in Step S14b are integrated for common use. Thus, Step S14a and Step S14b are performed in the same treatment tank.

In contrast, in the present Second Embodiment, an acidic chemical is used in Step S14c, and aqueous ammonia of an alkaline chemical is used in Step S14d. For this reason, the treatment tank for use in Step S14c, and the treatment tank for use in Step S14d cannot be integrated for common use, and are required to be provide separately. Namely, the following procedure is required: after performing Step S14c in the treatment tank for Step S14c (corresponding to a treatment tank BH1 described later), the wafers (semiconductor substrates SB) are transported from the treatment tank for Step S14c to the treatment tank for Step S14d (corresponding to a treatment tank BH2 described later), and Step S14d is performed in the treatment tank for Step S14d. Accordingly, during transportation of the wafers (semiconductor substrates SB) from the treatment tank for Step S14c to the treatment tank for Step S14d, the wafers are exposed to the air, so that an oxide film is formed at the surface of the gate electrode DG. The oxide film may cause the etching residue of the gate electrode DG. Further, during the transportation, the surface of each wafer is dried, so that a watermark is formed. This entails a concern about the formation of a defect resulting from the watermark.

For this reason, in the present Second Embodiment, in Step S14, the number of transportations between the treatment tanks is desirably minimized. Therefore, preferably, upon completion of the etching treatment by an acidic chemical in the treatment tank for Step S14c, a water washing treatment is performed in the treatment tank for Step S14c. Then, without performing a wafer drying step, the wafers are transported to the treatment tank for Step S14d. The etching treatment by aqueous ammonia is performed in the treatment tank for Step S14d. Upon completion thereof, the water washing treatment is performed in the treatment tank for Step S14d.

Incidentally, in the present Second Embodiment, after performing Step S14c in the treatment tank for Step S14c, the wafers are required to be transported from the treatment tank for Step S14c to the the treatment tank for Step S14d. However, in the First Embodiment, the APM treatment (corresponding to Step S14a) and the aqueous ammonia treatment (corresponding to Step S14b) can be performed in one treatment tank BH. Accordingly, in the First Embodiment, Step S14a and Step S14b can be continuously performed without exposing the wafers to the air. For this reason, in the First Embodiment, after removing the heterogeneous surface layer at the top surface of the gate electrode DG in Step S14a, the wafer is not exposed to the air. Accordingly, without the formation of an oxide film at the top surface of the gate electrode DG, the aqueous ammonia treatment (Step S14b) can be performed. First Embodiment is more advantageous in this point than the present Second Embodiment. Namely, the First Embodiment is more advantageous than the present Second Embodiment in that the concern can be avoided that between Step S14a and Step S14b, each wafer is exposed to the air to form an oxide film at the surface of the gate electrode DG. Further, the First Embodiment is also more advantageous than the present Second Embodiment in that the risk of formation of a watermark after Step S14a and before performing the aqueous ammonia treatment (Step S14b) can be avoided.

In the present Second Embodiment, in Step S14c, an acidic chemical is used. As the acidic chemical, there may be preferably used hydrofluoric acid (dilute hydrofluoric acid), FPM (Hydrofluoric acid—Hydrogen Peroxide Mixture), hydrochloric acid (dilute hydrochloric acid), or HPM. Incidentally, as described above, HPM is a mixed solution of hydrochloric acid, hydrogen peroxide, and water. Whereas, FPM is a mixed solution of hydrofluoric acid, hydrogen peroxide, and water.

In the present Second Embodiment, the heterogeneous surface layer formed at the top surface of the gate electrode DG before performing Step S14 is removed by an acidic chemical in Step S14c. When the heterogeneous surface layer is an oxide film or a nearly equivalent, as the acidic chemical for use in Step S14c, hydrofluoric acid (dilute hydrofluoric acid), or FPM is preferable. Alternatively, in the case where the heterogeneous surface layer contains a metal element, specifically, when a metal is deposited at the top surface of the gate electrode DG, when a metal element-rich etching inhibiting layer is deposited at the top surface of the gate electrode DG, or in other cases, as the acidic chemical for use in Step S14c, HPM is preferable.

The process sequence of the etching treatment of Step S14 when the acidic chemical for use in Step S14c is hydrofluoric acid will be described below by reference to FIG. 30.

Figure 30:
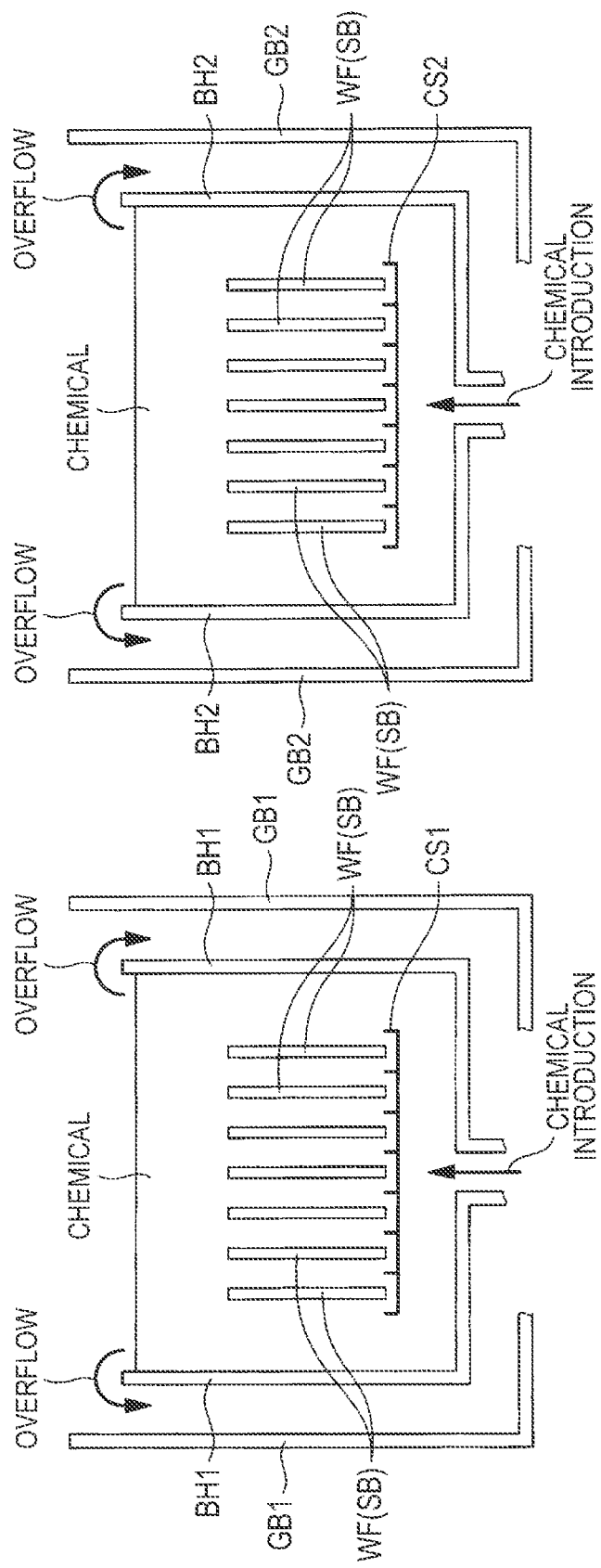
FIG. 30 is an explanatory view schematically showing the treatment device for use in Step S14 in another embodiment.

FIG. 30 is an explanatory view (cross sectional view) schematically showing the treatment device (etching device) for use in Step S14 in the present Second Embodiment. Incidentally, in FIG. 30, for ease of understanding of the drawing, hatching is omitted.

As shown in FIG. 30, in the present Second Embodiment, the treatment device for use in Step S14 is a batch type treatment device, and has two treatment tanks (chemical tanks) BH1 and BH2. Respective treatment tanks BH1 and BH2 are allowed to introduce (supply) respective chemicals from their respective bottoms into the treatment tanks BH1 and BH2, respectively. Further, the chemical introduced from the bottom of the treatment tank BH1 is stored in the treatment tank BH1. The chemical overflowed from the top of the treatment tank BH1 is to be collected in the external tank (collection tank) GB1. Similarly, the chemical introduced from the bottom of the treatment tank BH2 is stored in the treatment tank BH2. The chemical overflowed from the top of the treatment tank BH2 is to be collected in the external tank (collection tank) GB2. Further, in the treatment tank BH1, the trench CS1 of the wafer holding part is arranged, and in the treatment tank BH2, the trench CS2 of the wafer holding part is arranged. The trenches CS1 and CS2 of the wafer holding parts can arrange (accommodate) a plurality of wafers (semiconductor wafers) WF therein.

First, with the wafers WF not arranged in the trench CS1 of the wafer holding part in the treatment tank BH1, a chemical is introduced (supplied) from the bottom of the treatment tank BH1 into the treatment tank BH1. As the chemical at this step, for example, a chemical (hydrofluoric acid aqueous solution) obtained by diluting a hydrofluoric acid undiluted solution with a HF concentration of 50% by 500-fold pure water can be used. For example, room-temperature pure water and a hydrofluoric acid undiluted solution with a HF concentration of 50% are introduced into the treatment tank BH1 a. flow rates of 25 L/min and 50 ml/min, respectively for about 300 seconds. The volume of each treatment tanks BH1 and BH2 is, for example, about 40 L. The chemical (herein, hydrofluoric acid aqueous solution) overflowed from the top of the treatment tank BH1 is collected in the external tank GB1, but is not reused. The chemical (hydrofluoric acid aqueous solution) in the treatment tank BH1 is temperature controlled at room temperature (about 23° C.).

Then, after stopping the introduction of the chemical (herein, hydrofluoric acid aqueous solution) from the bottom of the treatment tank BH1 into the treatment tank BH1, a plurality of wafers WF are immersed in the chemical (hydrofluoric acid aqueous solution) stored in the treatment tank BH1. The plurality of wafers WF are arranged (accommodated) in the trench CS1 of the wafer holding part. Incidentally, the semiconductor substrates SB subjected to the steps up to just before performing Step S14 are immersed as the wafers WF in the chemical in the treatment tank BH1, and are arranged in the trench CS1 of the wafer holding part. The plurality of wafers WF arranged in the trench CS1 of the wafer holding part are kept being immersed in the chemical (hydrofluoric acid aqueous solution) stored in the treatment tank BH1 for a prescribed time (e.g., about 120 seconds). The wet treatment by the chemical (hydrofluoric acid treatment) is performed on each wafer WF. This corresponds to the wet etching treatment by an acidic chemical of Step S14c. Incidentally, the conditions herein referred to (such as the hydrofluoric acid concentration and the treatment time) are exemplified assuming the case where such etching as to be able to remove the thermal oxide film by about 1.2 nm is performed in Step S14c.

The wafers WF are kept being immersed in the chemical (hydrofluoric acid aqueous solution) stored in the treatment tank BH1 for a prescribed time. Then, the process transfers to the water washing treatment (rinsing treatment). The water washing treatment is the same as the water washing treatment to be performed in the treatment tank BH after the treatment by aqueous ammonia is performed in the treatment tank BH in the First Embodiment. For this reason, a repeated description thereon is herein omitted. Accordingly, Step S14c, and the subsequent water washing treatment are performed in the treatment tank BH1.

Then, the plurality of wafers WF arranged in the trench CS1 of the wafer holding part in the treatment tank BH1 are taken out, and are transported from the treatment tank BH1 to the treatment tank BH2. In the treatment tank BH2, aqueous ammonia has been previously stored as a chemical. The concentration of aqueous ammonia to be used, and the like can be set the same as those of Step S14b of the First Embodiment. Then, the plurality of wafers WF transported from the treatment tank BH1 to the treatment tank BH2 are immersed in the chemical (aqueous ammonia) stored in the treatment tank BH2, and are arranged (accommodated) in the trench CS2 of the wafer holding part. The plurality of wafers WF arranged in the trench CS2 of the wafer holding part are kept being immersed in the chemical (aqueous ammonia) stored in the treatment tank BH2 for a prescribed time (equivalent to that of the Step S14b). Each wafer WF is subjected to a wet treatment by the chemical (aqueous ammonia treatment). This corresponds to the wet etching treatment by aqueous ammonia of the Step S14d.

Each wafer WF is kept being immersed the chemical (aqueous ammonia) stored in the treatment tank BH2 for a prescribed time. Then, the process transfers to the water washing treatment (rinsing treatment). The water washing treatment is the same as the water washing treatment to be performed in the treatment tank BH after the treatment by aqueous ammonia is performed in the treatment tank BH in the First Embodiment. For this reason, a repeated description thereon is herein omitted. Accordingly, Step S14d, and the subsequent water washing treatment are performed in the treatment tank BH2.

Then, the plurality of wafers WF arranged in the trench CS2 of the wafer holding part are taken out, are moved to the outside of the treatment tank BH2, and are subjected to a drying treatment. As a result, Step S14 is completed, and the wafers WF are transported to a manufacturing device for performing the subsequent step.

Then, the process sequence of the etching step of Step S14 when the acidic chemical for use in Step S14c is HPM will be described below. Incidentally, HPM is lower in pH (hydrogen ion exponent), and more excellent in metal removing ability than APM, and has an advantage of being capable of avoiding the necessity of etching of the oxide film. However, HPM has an action of etching titanium nitride (TiN). For this reason, when HPM is used in Step S14c, for the protective film HM, without using titanium nitride (TiN), another material (e.g., a silicon oxide film or a silicon nitride film) is preferably used.

First, with the wafers WF not arranged in the trench CS1 of the wafer holding part in the treatment tank BH1, a chemical is introduced (supplied) from the bottom of the treatment tank BH1 into the treatment tank BH1. At this step, for example, about 70° C. warm water, HCl (hydrochloric acid), and $H_2O_2$ (hydrogen peroxide) are introduced at flow rates of 25 L/min, 125 ml/min, and 500 ml/min, respectively, for about 300 seconds into the treatment tank BH1. As a result, a chemical including HPM with a concentration ratio of $HCl:H_2O_2:H_2O$=about 1:4:200 is stored in the treatment tank BH1. The temperature of the chemical in the treatment tank BH1 is about 70° C. The chemical (herein, HPM) overflowed from the top of the treatment tank BH1 is collected in the external tank GB1, but is not reused.

Then, the introduction of the chemical (herein, HPM) from the bottom of the treatment tank BH1 into the treatment tank BH1 is stopped, and it is checked that the temperature of the chemical (HPM) stored in the treatment tank BH1 has been stabilized. Then, a plurality of wafers WF are immersed in the chemical (HPM) stored in the treatment tank BH1, and are arranged (accommodated) in the trench CS of the wafer holding part. The plurality of wafers WF arranged in the trench CS1 of the wafer holding part are kept being immersed in the chemical (HPM) stored in the treatment tank BH1 for a prescribed time (e.g., about 600 seconds). The wet treatment by the chemical (HPM chemical) is performed on each wafer WF. This corresponds to the wet etching treatment by an acidic chemical of the Step S14c.

Each wafer WF is kept being immersed the chemical (HPM) stored in the treatment tank BH1 for a prescribed time. Then, the process transfers to the water washing treatment (rinsing treatment). The water washing treatment is the same as the water washing treatment to be performed in the treatment tank BH after the treatment by aqueous ammonia is performed in the treatment tank BH in the First Embodiment. For this reason, a repeated description thereon is herein omitted. Accordingly, Step S14c, and the subsequent water washing treatment are performed in the treatment tank BH1.

Thereafter, the case using HPM in Step S14c is also the same as the case using hydrofluoric acid in Step S14c. The plurality of wafers WF are transported from the treatment tank BH1 to the treatment tank BH2, and are subjected to the treatment by aqueous ammonia of Step S14d, and the subsequent water washing treatment in the treatment tank BH2. A repeated description thereon is herein omitted.

Thus, in the present Second Embodiment, the Step S14c is performed by immersing the wafers WF (semiconductor substrates SB) in the acidic chemical in the treatment tank BH1. The Step S14d is performed by immersing the wafers WF (semiconductor substrates SB) in the chemical (i.e., aqueous ammonia) in the treatment tank BH2. The acidic chemical for use in Step S14c preferably includes hydrofluoric acid (dilute hydrofluoric acid), FPM (Hydrofluoric acid—Hydrogen Peroxide Mixture), hydrochloric acid (dilute hydrochloric acid), or HPM. As described above, between the treatment by an acidic chemical of Step S14c and the treatment by aqueous ammonia of Step S14d, the step of subjecting the wafers WF (semiconductor substrates SB) to the water washing treatment in the treatment tank BH1 is performed. Further, after Step S14d (aqueous ammonia treatment), the step of subjecting the wafers WF (semiconductor substrates SB) to the water washing treatment in the treatment tank BH2 is performed. Then, subsequent steps (Steps S15, S16, and S17) are performed.

Third Embodiment

In the present Third Embodiment, the differences from the First Embodiment will be mainly described. The same points as those in the First Embodiment will not be repeatedly described.

Figure 31:
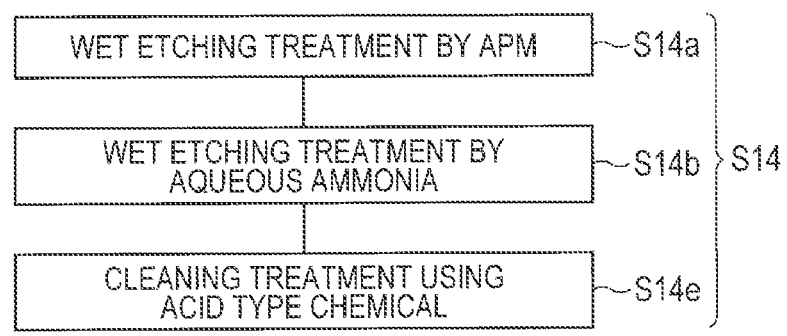
FIG. 31 is a process flowchart showing the details of the etching step of Step S14 in a still other embodiment.

FIG. 31 is a process flowchart showing the details of the etching step of the Step S14 in the present Third Embodiment, and corresponds to the FIG. 27 of the First Embodiment In the present embodiment, in Step S14, the Step S14a (APM treatment) and the Step S14b (aqueous ammonia treatment) are continuously performed. Then, the step (Step S14 of FIG. 31e) of washing the semiconductor substrate SB (wafer WF) using an acidic chemical (washing solution) is performed.

After Step S14, an insulation film HK for gate insulation film is formed in Step S15. Before forming the insulation film HK, preferably, a washing treatment using an acidic chemical is performed. With the washing treatment using an acidic chemical, a metal contaminant, or the like can be removed, and the insulation film HK can be formed over the each cleaned film. This can improve the reliability of the manufactured semiconductor device. For this reason, after Step S14b, and before Step S15, the washing treatment using an acidic chemical (Step S14e of FIG. 31) is performed. As the acidic chemical (washing solution) for use in Step S14e, SPM, HPM, or hydrochloric acid (dilute hydrochloric acid) can be preferably used.

In the present Third Embodiment, the washing treatment (prewashing treatment) using an acidic chemical to be performed before forming the insulation film HK for gate insulation film is performed as Step S14e continuously after Steps S14a and S14b. For this reason, in the present Third Embodiment, Steps S14a, S14b, and S14e can be performed using one treatment device. Further, in the present Third Embodiment, preferably a drying step is not performed between Step S14b and Step S14e. Namely, preferably, after performing Steps S14a and S14b in the same manner as in the First Embodiment, without performing the drying step of the wafer WF (semiconductor substrate SB), Step S14e is performed. As a result, it is possible to avoid the risk of formation of foreign matters such as watermarks before performing Step S14e. This can prevent the generation of defects due to the foreign matters such as watermarks.

The process sequence of the etching step of Step S14 in the present Third Embodiment will be described by reference to FIG. 32 below.

Figure 32:
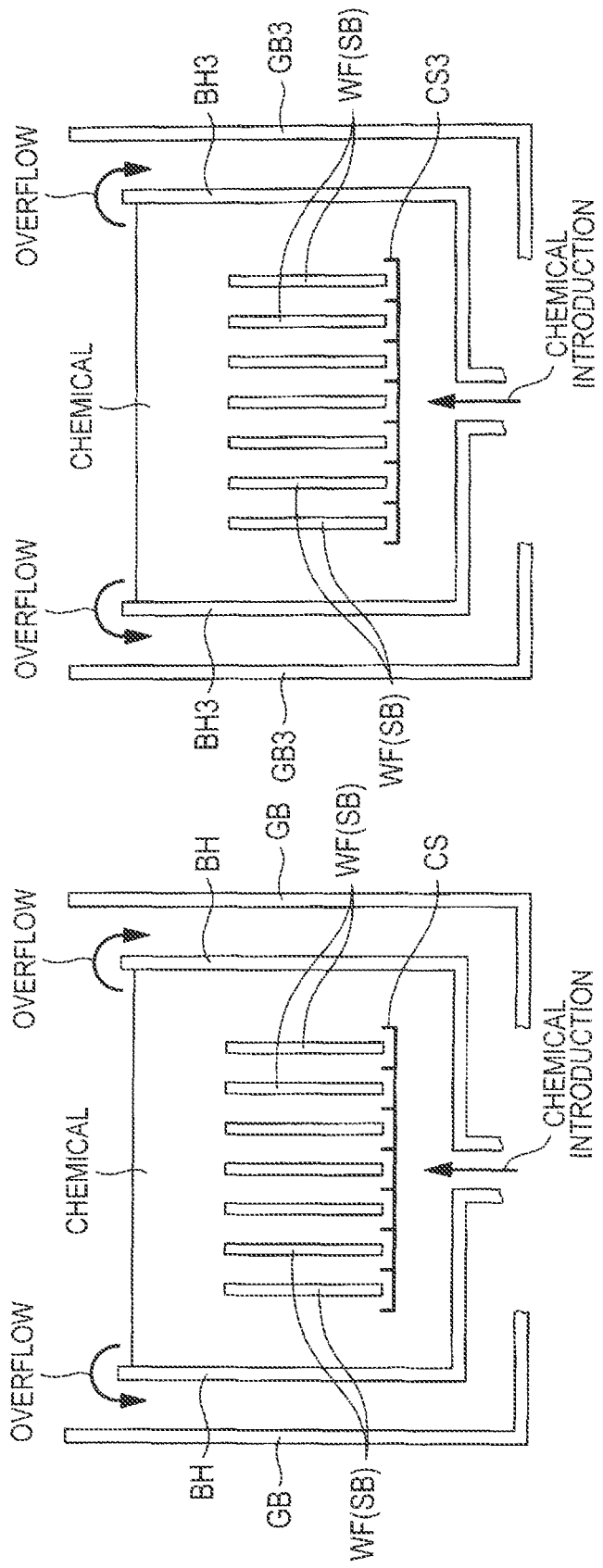
FIG. 32 is an explanatory view schematically showing the treatment device for use in Step S14 in a still other embodiment.

FIG. 32 is an explanatory view (cross sectional view) schematically showing the treatment device (etching device) for use in Step S14 in the present Third Embodiment. Incidentally, in FIG. 32, for ease of understanding of the drawing, hatching is omitted.

As shown in FIG. 32, in the present Third Embodiment, the treatment device for use in Step S14 is a batch type treatment device, and has two treatment tanks (chemical tanks) BH and BH3. Respective treatment tanks BH and BH3 allow chemicals to be introduced (supplied) from their respective bottoms into the treatment tanks BH and BH3, respectively. Further, the chemical introduced from the bottom of the treatment tank BH is stored in the treatment tank BH. However, the chemical overflowed from the top of the treatment tank BH is to be collected in an external tank (collection tank) GB. Similarly, the chemical introduced from the bottom of the treatment tank BH3 is stored in the treatment tank BH3. However, the chemical overflowed from the top of the treatment tank BH3 is to be collected in an external tank (collection tank) GB3. Further, the trench CS of the wafer holding part is arranged in the treatment tank BH, and the trench CS3 of the wafer holding part is arranged in the treatment tank BH3. In the trench CS or CS3 of the wafer holding part, a plurality of wafers (semiconductor wafers) WF can be arranged (accommodated).

In the present Third Embodiment, the APM treatment (Step S14a) and the aqueous ammonia treatment (Step S14b) are performed in the treatment tank BH in the same manner as in the First Embodiment. Then, a water washing treatment (rinsing treatment) is performed in the treatment tank BH in the same manner as in the First Embodiment. However, a repeated description thereon is herein omitted. Thereafter, in the present Third Embodiment, the plurality of wafers WF arranged in the trench CS of the wafer holding part in the treatment tank BH are taken out, and are transported from the treatment tank BH to the treatment tank BH3 without performing the drying treatment of the wafers WF. In the treatment tank BH3, as the chemical (washing solution), an acidic chemical has been previously stored. The acidic chemical is introduced (supplied) from the bottom of the treatment tank BH3 into the treatment tank BH3. The chemical overflowed from the top of the treatment tank BH3 is collected in the external tank GB3, but is not reused. Then, the plurality of wafers WF transported from the treatment tank BH to the treatment tank BH3 are immersed in the chemical (acidic chemical) stored in the treatment tank BH3, and are arranged (accommodated) in the trench CS3 of the wafer holding part. When the wafers WF are immersed in the chemical in the treatment tank BH3, the introduction of the chemical from the bottom of the treatment tank BH3 into the treatment tank BH3 is stopped. The plurality of wafers WF arranged in the trench CS3 of the wafer holding part are kept being immersed in the chemical (acidic chemical) stored in the treatment tank BH3 for a prescribed time. The wet treatment by the chemical is performed on each wafer WF. This corresponds to the washing treatment by the acidic chemical of the Step S14e. Namely, the washing treatment (washing step) of Step S14e is performed by immersing the wafers WF (semiconductor substrates SB) in the chemical (washing solution) in the treatment tank BH3. The acidic chemical (washing solution) for use in Step S14e preferably includes SPM, HPM, or hydrochloric acid. As described above, in the present Third Embodiment, the treatment (step) of drying the semiconductor wafers WF (semiconductor substrates SB) is not performed between the etching treatment by aqueous ammonia of Step S14b and the washing treatment by the acidic chemical of Step S14e.

Each wafer WF is kept being immersed the chemical (acidic chemical) stored in the treatment tank BH3 for a prescribed time. Then, the process transfers to the water washing treatment (rinsing treatment). The water washing treatment is the same as the water washing treatment to be performed in the treatment tank BH after the treatment by aqueous ammonia is performed in the treatment tank BH in the First Embodiment. For this reason, a repeated description thereon is herein omitted. Accordingly, Step S14e, and the subsequent water washing treatment are performed in the treatment tank BH3.

Thereafter, the plurality of wafers WF arranged in the trench CS3 of the wafer holding part are taken out, are moved to the outside of the treatment tank BH3, and are subjected to a drying treatment. As a result, Step S14 is completed. The wafers WF are transported to a manufacturing device for performing the subsequent step.

Incidentally, when the acidic chemical stored in the treatment tank BH3 is SPM, the concentration ratio (volume mixing ratio) of the chemical can be set at, for example, $H_2SO_4:H_2O_2$=about 5:1 (water being contained in a prescribed amount). The temperature of the chemical can be set at, for example, about 140° C. The treatment time (the time during which the wafer WF is immersed in the chemical) can be set at, for example, about 600 seconds.

Further, when the acidic chemical stored in the treatment tank BH3 is HPM, the concentration ratio (volume mixing ratio) of the chemical can be set at, for example, $HCl:H_2O_2:H_2O$=about 1:4:200. The temperature of the chemical can be set at, for example, about 70° C. The treatment time (the time during which the wafer WF is immersed in the chemical) can be set at, for example, about 600 seconds.

Whereas, when the acidic chemical stored in the treatment tank BH3 is hydrochloric acid (dilute hydrochloric acid), the concentration ratio (volume mixing ratio) of the chemical can be set at, for example, $HCl:H_2O$=about 1:2000. The temperature of the chemical can be set at, for example, room temperature (about 23° C.). The treatment time (the time during which the wafer WF is immersed in the chemical) can be set at, for example, about 120 seconds.

Up to this point, the invention completed by the present inventors was described specifically by way of the embodiments. However, it is naturally understood that the present invention is not limited to the embodiments, and may be variously changed within the scope not departing from the gist thereof.

What is claimed is:

1. A method for manufacturing a semiconductor device, comprising the steps of:
   (a) providing a semiconductor substrate;
   (b) forming a dummy gate electrode including silicon over the semiconductor substrate;
   (c) after the step (b), forming a first semiconductor region for source or drain of a MISFET in the semiconductor substrate by an ion implantation method;
   (d) after the step (c), forming a first insulation film over the semiconductor substrate in such a manner as to cover the dummy gate electrode;
   (e) after the step (d), polishing the first insulation film, and exposing the dummy gate electrode;
   (f) after the step (e), wet etching the surface of the dummy gate electrode by APM;
   (g) after the step (f), removing the dummy gate electrode by wet etching using aqueous ammonia; and
   (h) after the step (g), forming a gate electrode for the MISFET in a first trench of a region from which the dummy gate electrode has been removed.

2. The method for manufacturing a semiconductor device according to claim 1, and
   wherein the step (f) is performed by immersing the semiconductor substrate in a chemical including APM in a first treatment tank,
   wherein the step (g) is performed by replacing APM with aqueous ammonia as the chemical in which the semiconductor substrate has been immersed.

3. The method for manufacturing a semiconductor device according to claim 2,
   wherein a step of subjecting the semiconductor substrate to a water washing treatment is not performed between the step (f) and the step (g).

4. The method for manufacturing a semiconductor device according to claim 2,
   wherein in the step (g), with the semiconductor substrate immersed in the chemical in the first treatment tank, while introducing aqueous ammonia into the first treatment tank, the chemical is caused to overflow from the first treatment tank, thereby to replace APM with aqueous ammonia as the chemical in the first treatment tank.

5. The method for manufacturing a semiconductor device according to claim 4,
wherein in the step (g), aqueous ammonia is introduced from the bottom of the first treatment tank into the first treatment tank, thereby to cause the chemical to overflow from the top of the first treatment tank.

6. The method for manufacturing a semiconductor device according to claim 4,
wherein in the step (g), after introducing aqueous ammonia into the first treatment tank during a first time, the introduction of aqueous ammonia into the first treatment tank is stopped, and the semiconductor substrate is kept being immersed in the chemical in the first treatment tank during a second time.

7. The method for manufacturing a semiconductor device according to claim 2,
wherein after the step (g), and before the step (h), a step of subjecting the semiconductor substrate to a water washing treatment in the first treatment tank is performed.

8. The method for manufacturing a semiconductor device according to claim 1,
wherein in the step (b), the dummy gate electrode is formed over the semiconductor substrate via a second insulation film.

9. The method for manufacturing a semiconductor device according to claim 8,
wherein in the step (g), the second insulation film is left at the bottom of the first trench.

10. The method for manufacturing a semiconductor device according to claim 9,
wherein the second insulation film is a silicon oxide film or a silicon oxynitride film.

11. The method for manufacturing a semiconductor device according to claim 9,
wherein the gate electrode is a metal gate electrode.

12. The method for manufacturing a semiconductor device according to claim 11,
wherein in the step (g), the gate electrode is formed in the first trench via a third insulation film, and
wherein the third insulation film is a high dielectric constant insulation film.

13. The method for manufacturing a semiconductor device according to claim 12, further comprising, after the step (c) and before the step (d), a step or
(c1) forming a metal silicide layer over the first semiconductor region.

14. The method for manufacturing a semiconductor device according to claim 1, further comprising, after the step (g) and before the step (h), a step of
(g1) washing the semiconductor substrate using an acidic washing solution.

15. The method for manufacturing a semiconductor device according to claim 14,
wherein the washing step is performed by immersing the semiconductor substrate in the washing solution in a second treatment tank, and
wherein a step of drying the semiconductor substrate is not performed between the step (g) and the step (g1).

16. The method for manufacturing a semiconductor device according to claim 15,
wherein the washing solution includes SPM, HPM, or hydrochloric acid.

17. A method for manufacturing a semiconductor device, comprising the steps of
(a) providing a semiconductor substrate;
(b) forming a dummy gate electrode including silicon over the semiconductor substrate;
(c) after the step (b), forming a first semiconductor region for source or drain of a MISFET in the semiconductor substrate by an ion implantation method;
(d) after the step (c), forming a first insulation film over the semiconductor substrate in such a manner as to cover the dummy gate electrode;
(e) after the step (d), polishing the first insulation film, and exposing the dummy gate electrode;
(f) after the step (e), wet etching the surface of the dummy gate electrode by an acidic first chemical;
(g) after the step (f), removing the dummy gate electrode by wet etching using a second chemical including aqueous ammonia; and
(h) after the step (g), forming a gate electrode for the MISFET in a first trench of a region from which the dummy gate electrode has been removed.

18. The method for manufacturing a semiconductor device according to claim 17,
wherein the step (f) is performed by immersing the semiconductor substrate in the first chemical in a first treatment tank, and
wherein the step (g) is performed by immersing the semiconductor substrate in the second chemical in a second treatment tank.

19. The method for manufacturing a semiconductor device according to claim 18,
wherein a step of subjecting the the semiconductor substrate to a water washing treatment in the first treatment tank is performed between the step (f) and the step (g).

20. The method for manufacturing a semiconductor device according to claim 17,
wherein the first chemical includes hydrofluoric acid, hydrochloric acid, or HPM.

* * * * *